(12) United States Patent
Yamazaki

(10) Patent No.: US 9,705,001 B2
(45) Date of Patent: Jul. 11, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kangawa-ken (JP)

(*) Notice: Subject to any disclaimer, the term of this patent is extended or adjusted under 35 U.S.C. 154(b) by 0 days.

(21) Appl. No.: 14/198,913

(22) Filed: Mar. 6, 2014

(65) Prior Publication Data
US 2014/0264324 A1 Sep. 18, 2014

(30) Foreign Application Priority Data
Mar. 13, 2013 (JP) ................................. 2013-050829

(51) Int. Cl.
*H01L 29/786* (2006.01)
(52) U.S. Cl.
CPC .... *H01L 29/7869* (2013.01); *H01L 29/78648* (2013.01); *H01L 29/78696* (2013.01)
(58) Field of Classification Search
CPC ........... H01L 29/78648; H01L 29/7869; H01L 29/78696
See application file for complete search history.

(56) References Cited

U.S. PATENT DOCUMENTS

| 5,731,856 A | 3/1998 | Kim et al. |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| CN | 001753156 A | 3/2006 |
|---|---|---|
| CN | 102656699 A | 9/2012 |

(Continued)

OTHER PUBLICATIONS

International Search Report (Application No. PCT/JP2014/057020) Dated Jun. 10, 2014.

(Continued)

*Primary Examiner* — A. Sefer
*Assistant Examiner* — Benjamin Tzu-Hung Liu
(74) *Attorney, Agent, or Firm* — Fish & Richardson P.C.

(57) ABSTRACT

The semiconductor device includes an oxide semiconductor layer including a plurality of channel formation regions arranged in the channel width direction and parallel to each other and a gate electrode layer covering a side surface and a top surface of each channel formation region with a gate insulating layer placed between the gate electrode layer and the channel formation regions. With this structure, an electric field is applied to each channel formation region from the side surface direction and the top surface direction. This makes it possible to favorably control the threshold voltage of the transistor and improve the S value thereof. Moreover, with the plurality of channel formation regions, the transistor can have increased effective channel width; thus, a decrease in on-state current can be prevented.

14 Claims, 14 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,392 B2 | 9/2006 | Isobe et al. |
| 7,105,868 B2 | 9/2006 | Nause et al. |
| 7,109,069 B2 | 9/2006 | Kokubo et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,394,116 B2 | 7/2008 | Kim et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,611,932 B2 | 11/2009 | Yin et al. |
| 7,674,650 B2 | 3/2010 | Akimoto et al. |
| 7,732,819 B2 | 6/2010 | Akimoto et al. |
| 7,892,898 B2 * | 2/2011 | Oba ............... H01L 21/845 257/192 |
| 8,274,079 B2 | 9/2012 | Yamazaki |
| 8,283,653 B2 | 10/2012 | Pillarisetty et al. |
| 8,575,596 B2 | 11/2013 | Pillarisetty et al. |
| 8,674,354 B2 | 3/2014 | Yamazaki |
| 8,692,252 B2 | 4/2014 | Takata et al. |
| 8,754,409 B2 | 6/2014 | Yamazaki et al. |
| 8,878,180 B2 | 11/2014 | Yamazaki |
| 9,202,923 B2 | 12/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0084204 A1 | 4/2006 | Yin et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0075372 A1 | 4/2007 | Terashima et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 * | 8/2007 | Furuta ............... H01L 29/41733 257/347 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0014795 A1 | 1/2009 | Koh et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0140100 A1 | 6/2011 | Takata et al. |
| 2011/0147711 A1 | 6/2011 | Pillarisetty et al. |
| 2012/0241739 A1 | 9/2012 | Yamazaki et al. |
| 2012/0252173 A1 | 10/2012 | Imoto et al. |
| 2012/0292614 A1 * | 11/2012 | Matsubayashi ............... 257/43 |
| 2012/0319183 A1 * | 12/2012 | Yamazaki ............ H01L 29/7782 257/288 |
| 2013/0277670 A1 | 10/2013 | Isobe |
| 2014/0054548 A1 | 2/2014 | Pillarisetty et al. |
| 2014/0103397 A1 | 4/2014 | Pillarisetty et al. |
| 2014/0151691 A1 | 6/2014 | Matsubayashi et al. |
| 2016/0071889 A1 | 3/2016 | Yamazaki |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-250770 A | 11/1991 |
| JP | 05-251705 A | 9/1993 |
| JP | 08-264794 A | 10/1996 |
| JP | 10-065177 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-013521 A | 1/2006 |
| JP | 2006-093715 A | 4/2006 |
| JP | 2009-206306 A | 9/2009 |
| JP | 2011-124360 A | 6/2011 |
| JP | 4930056 | 5/2012 |
| JP | 2012-216796 A | 11/2012 |
| JP | 2012-216802 A | 11/2012 |
| JP | 2013-513250 | 4/2013 |

(56) References Cited

FOREIGN PATENT DOCUMENTS

| KR | 2006-0028595 A | 3/2006 |
|---|---|---|
| WO | WO-2004/114391 | 12/2004 |
| WO | WO-2006/011369 | 2/2006 |
| WO | WO-2011/087570 | 7/2011 |

OTHER PUBLICATIONS

Written Opinion (Application No. PCT/JP2014/057020) Dated Jun. 10, 2014.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2. 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", Journal of the SID, 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTs", IDW '09 : Proccedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

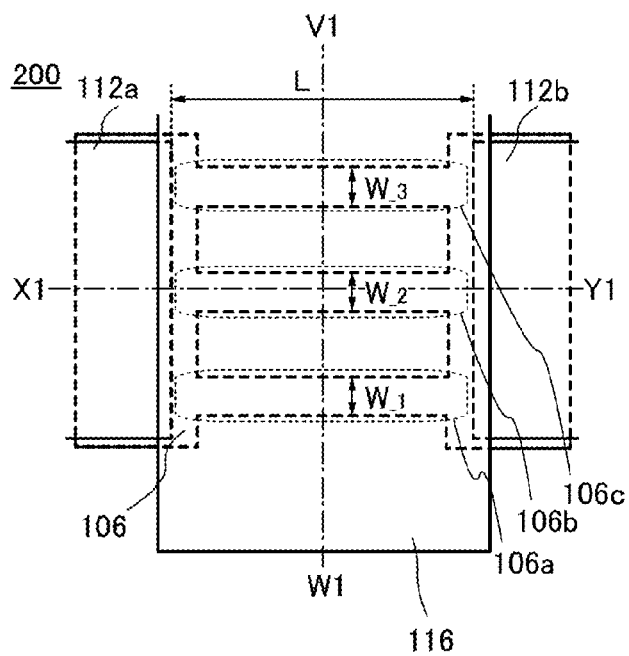
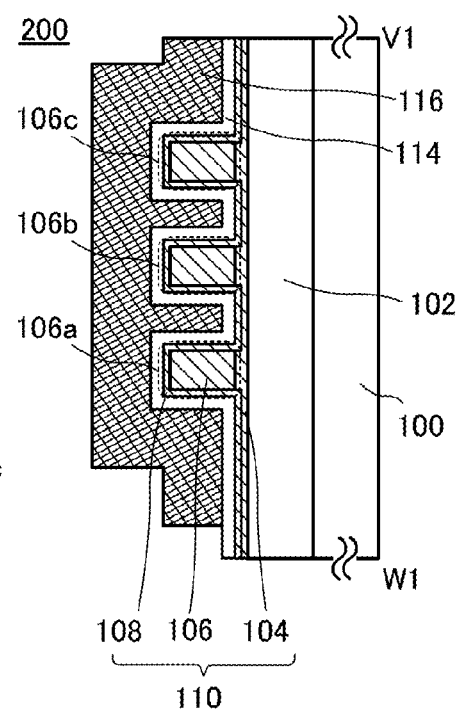
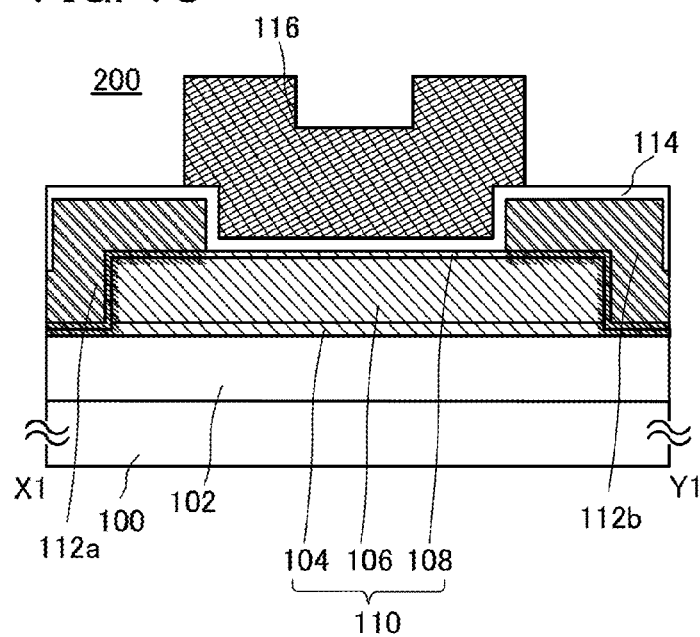

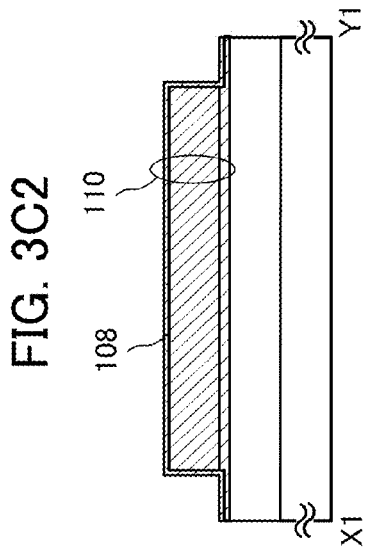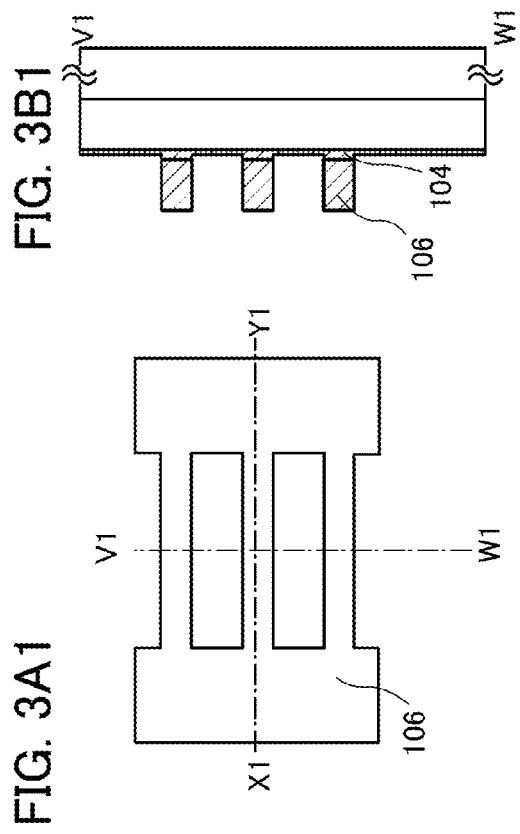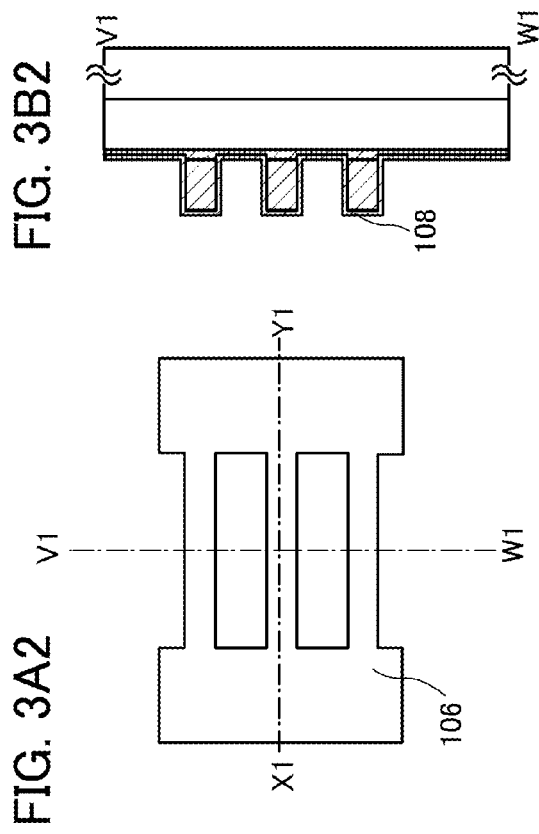

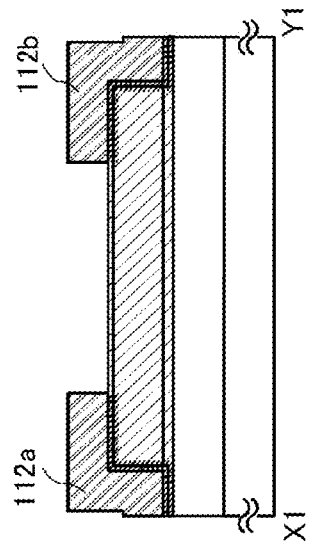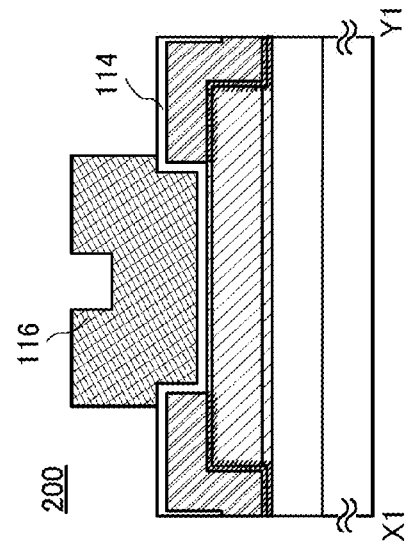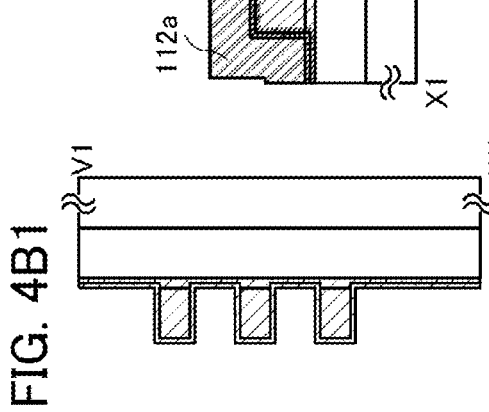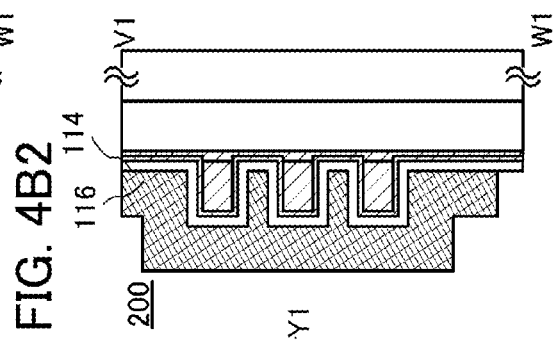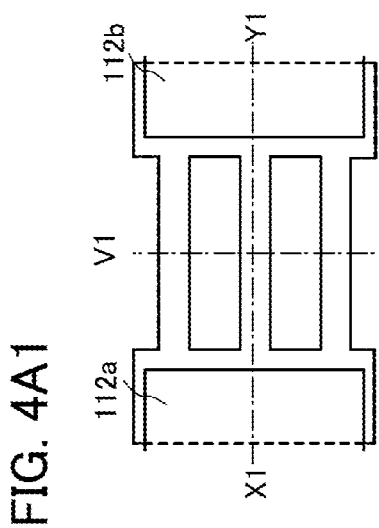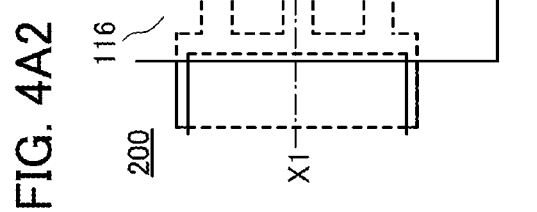

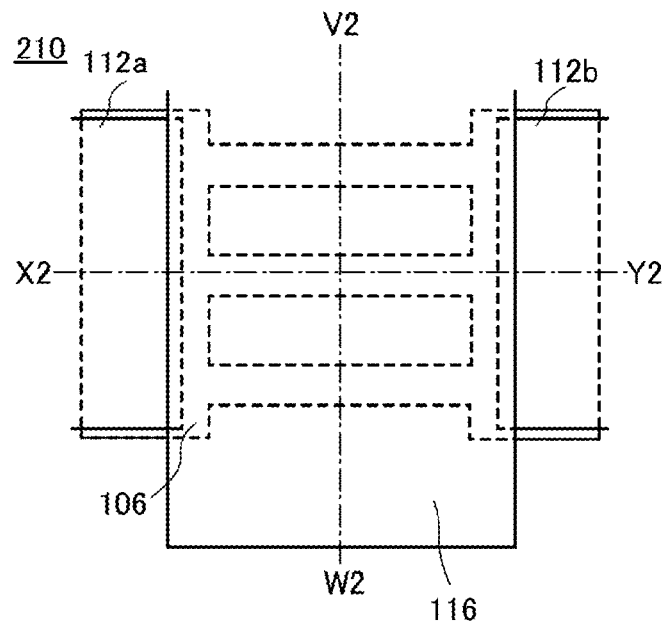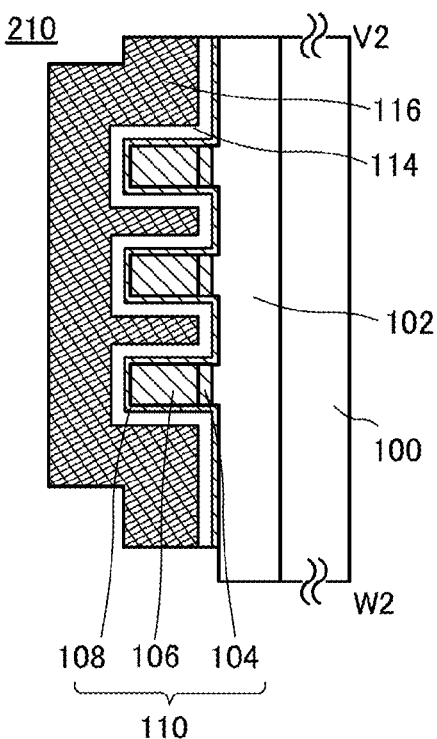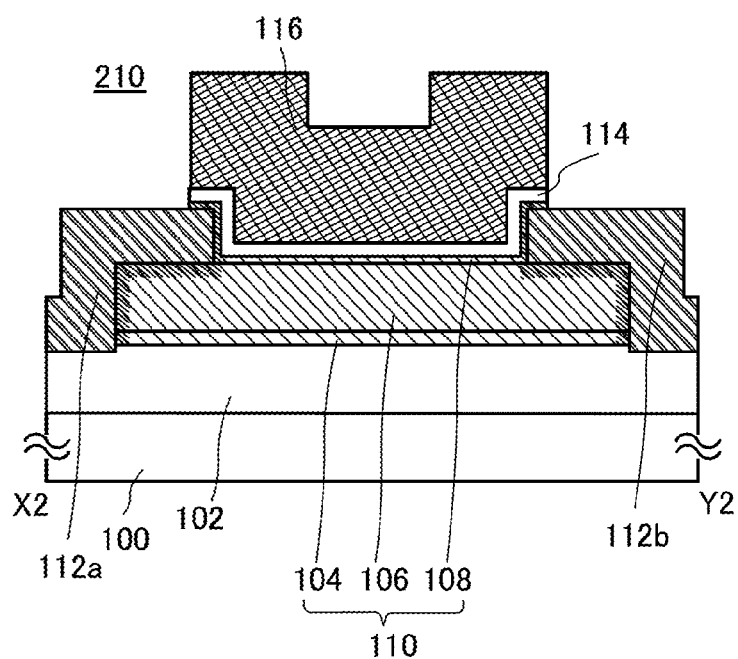

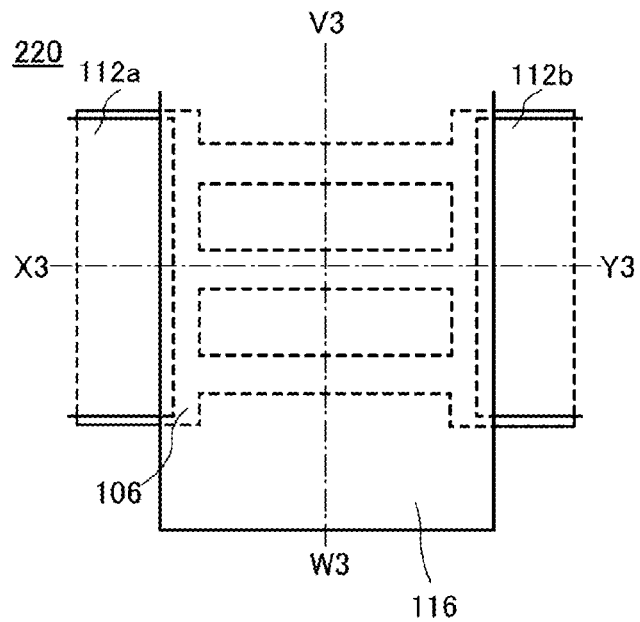
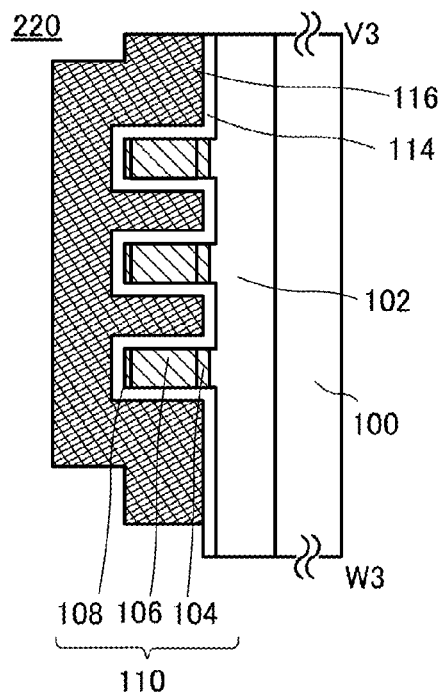
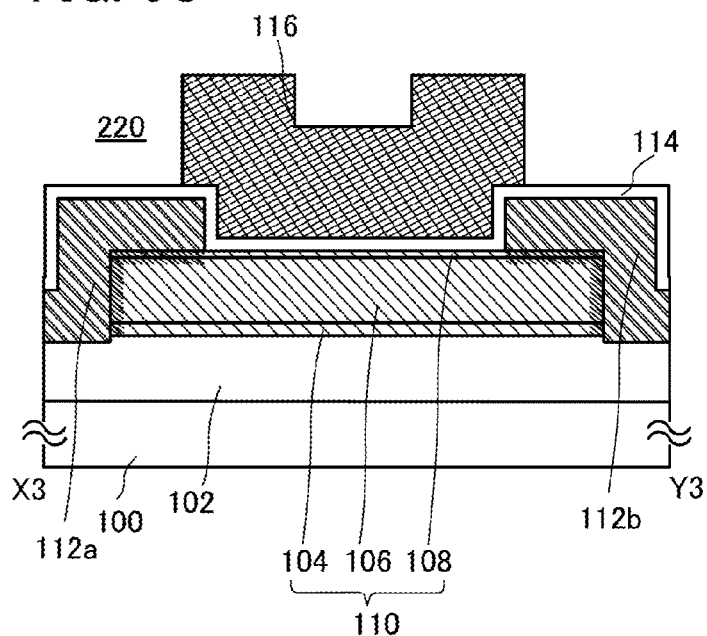

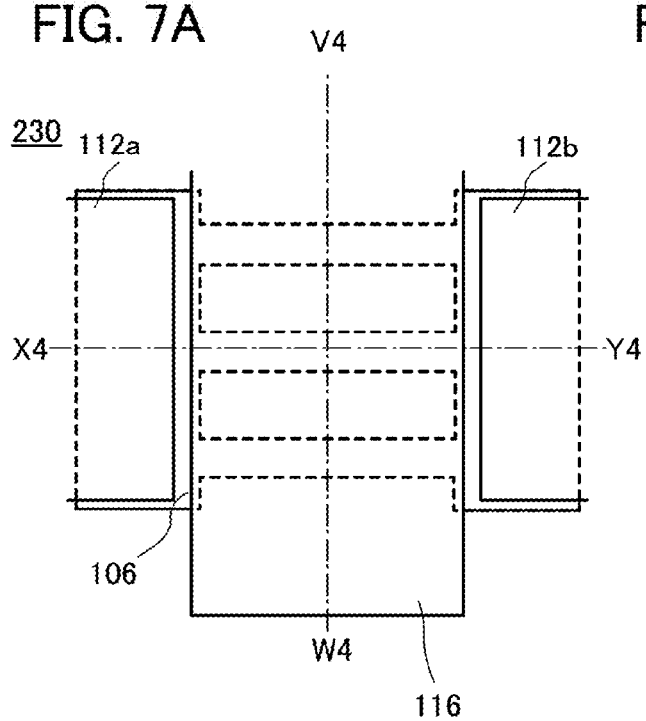
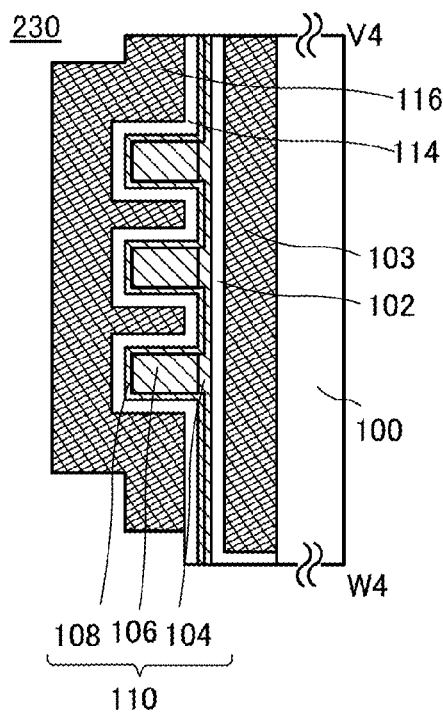
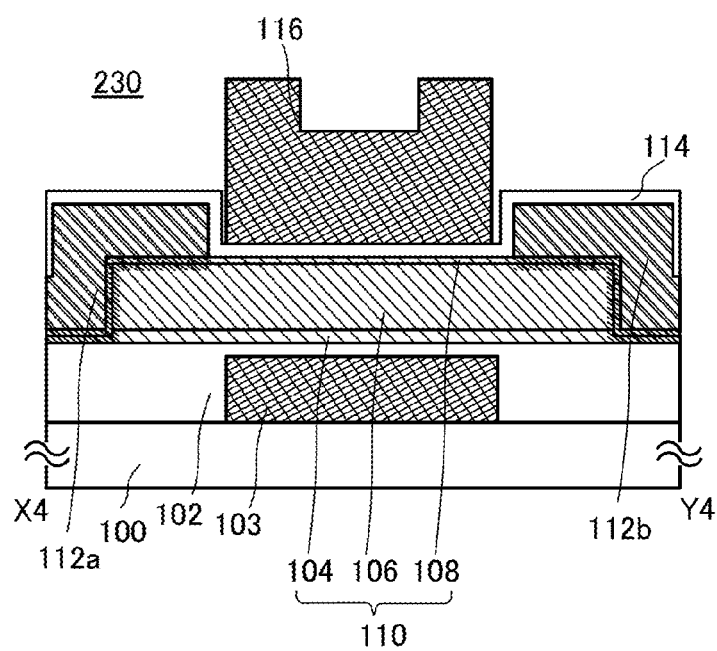

CAAC nc

SEMICONDUCTOR DEVICE

TECHNICAL FIELD

One embodiment of the disclosed invention relates to a semiconductor device.

In this specification and the like, a semiconductor device generally means a device that can function by utilizing semiconductor characteristics. For example, a semiconductor element such as a transistor; a power device; an integrated circuit, a power supply circuit, or a power converter circuit including a power device; an electro-optical device; a semiconductor circuit; and an electronic device may be included in a semiconductor device or may include a semiconductor device.

BACKGROUND ART

Transistors in which an active layer is formed using a semiconductor thin film which is formed over a substrate having an insulating surface are widely used in electronic devices such as integrated circuits (ICs) and image display devices (also simply referred to as display devices).

In general, formation of a highly-integrated circuit requires miniaturization of a transistor. Conventional thin film transistors mostly have what is called a planar structure, in which a semiconductor film, an insulating film, and an electrode are stacked over a plane. As a transistor for a highly-integrated semiconductor device, a fin-type transistor in which a polycrystalline silicon film is used as an active layer is disclosed.

PATENT DOCUMENT

[Patent Document 1] Japanese Published Patent Application No. 2009-206306

DISCLOSURE OF INVENTION

To achieve quick response and high-speed operation of a semiconductor device, improvement in on-state characteristics (e.g., on-state current and field effect mobility) of a miniaturized transistor is needed. However, since a channel width decreases with miniaturization of a transistor, the on-state current is likely to be reduced. In addition, it is known that miniaturization of a transistor causes deterioration or variation in its electrical characteristics, such as a negative shift of the threshold voltage or deterioration of a subthreshold value (S value).

Thus, an object of one embodiment of the present invention is to provide a semiconductor device having a structure that can prevent deterioration in electrical characteristics, which becomes more significant with miniaturization of a transistor. Another object of one embodiment of the present invention is to provide a semiconductor device with low power consumption. Another object of one embodiment of the present invention is to provide a semiconductor device with high reliability.

Note that the descriptions of these objects do not disturb the existence of other objects. In one embodiment of the present invention, there is no need to achieve all the objects. Other objects will be apparent from and can be derived from the description of the specification and the like.

A semiconductor device of one embodiment of the present invention includes an oxide semiconductor layer including at least a first channel formation region and a second channel formation region arranged in the channel width direction and parallel to each other. Further, a gate electrode layer is provided to cover a side surface and a top surface of each channel formation region with a gate insulating layer provided therebetween. With such a structure, an electric field is applied to each channel formation region from the side surface direction and the top surface direction. This makes it possible to favorably control the threshold voltage of the transistor and improve the S value thereof. Moreover, with the plurality of channel formation regions, the transistor can have increased effective channel width; thus, a decrease in on-state current can be prevented.

Further, a semiconductor device of one embodiment of the present invention includes an oxide layer between an oxide semiconductor layer and an insulating layer that overlaps with the oxide semiconductor layer. The oxide layer contains at least one of metal elements contained in the oxide semiconductor layer. When the oxide semiconductor layer is in contact with the insulating layer, a trap state can be formed at the interface between the oxide semiconductor layer and the insulating layer. The above structure including the oxide layer between the oxide semiconductor layer and the insulating layer suppresses formation of the trap state and thus can prevent deterioration of electrical characteristics of a transistor.

More specifically, the following structures can be employed, for example.

One embodiment of the present invention is a semiconductor device including an oxide semiconductor layer including at least a first channel formation region and a second channel formation region, a first oxide layer in contact with a bottom surface of the oxide semiconductor layer, a second oxide layer in contact with a top surface of the oxide semiconductor layer, a source electrode layer and a drain electrode layer electrically connected to the oxide semiconductor layer, a gate electrode layer which is over the oxide semiconductor layer and covers a side surface and a top surface of the first channel formation region and a side surface and a top surface of the second channel formation region, and a gate insulating layer between the oxide semiconductor layer and the gate electrode layer.

Another embodiment of the present invention is a semiconductor device including an oxide semiconductor layer including at least a first channel formation region and a second channel formation region, a first oxide layer in contact with a bottom surface of the oxide semiconductor layer, a second oxide layer in contact with a top surface of the oxide semiconductor layer, a source electrode layer and a drain electrode layer electrically connected to the oxide semiconductor layer, a first gate electrode layer which is over the oxide semiconductor layer and covers a side surface and a top surface of the first channel formation region and a side surface and a top surface of the second channel formation region, a second gate electrode layer which is below the oxide semiconductor layer and overlaps with the first channel formation region and the second channel formation region, a first gate insulating layer between the second oxide layer and the first gate electrode layer, and a second gate insulating layer between the first oxide layer and the second gate electrode layer.

In the above semiconductor device, the first oxide layer and the second oxide layer each contain at least one of metal elements contained in the oxide semiconductor layer.

In the above semiconductor device, the second oxide layer may be provided over the oxide semiconductor layer to cover a side surface and a top surface of the first channel formation region and a side surface and a top surface of the second channel formation region and may be in contact with the first oxide layer in a region between the first channel formation region and the second channel formation region.

In the above semiconductor device, an end portion of the first oxide layer, an end portion of the oxide semiconductor layer, and an end portion of the second oxide layer may be aligned with each other in a cross section.

In the above semiconductor device, the source electrode layer and the drain electrode layer may be in contact with a side surface of the first oxide layer and a side surface and a top surface of the oxide semiconductor layer.

With one embodiment of the present invention, it is possible to provide a semiconductor device having a structure that can prevent deterioration in electrical characteristics, which becomes more significant with miniaturization of a transistor. With one embodiment of the present invention, it is possible to provide a semiconductor device with low power consumption. With one embodiment of the present invention, it is possible to provide a semiconductor device with high reliability.

BRIEF DESCRIPTION OF DRAWINGS

FIGS. 1A to 1C are a plan view and cross-sectional views illustrating one embodiment of a semiconductor device.

FIGS. 3A1, 3A2, 3B1, 3B2, 3C1, and 3C2 are plan views and cross-sectional views illustrating an example of a method for manufacturing a semiconductor device.

FIGS. 4A1, 4A2, 4B1, 4B2, 4C1, and 4C2 are plan views and cross-sectional views illustrating an example of a method for manufacturing a semiconductor device.

FIGS. 5A to 5C are a plan view and cross-sectional views illustrating one embodiment of a semiconductor device.

FIGS. 6A to 6C are a plan view and cross-sectional views illustrating one embodiment of a semiconductor device.

FIGS. 7A to 7C are a plan view and cross-sectional views illustrating one embodiment of a semiconductor device.

BEST MODE FOR CARRYING OUT THE INVENTION

Figure 2:
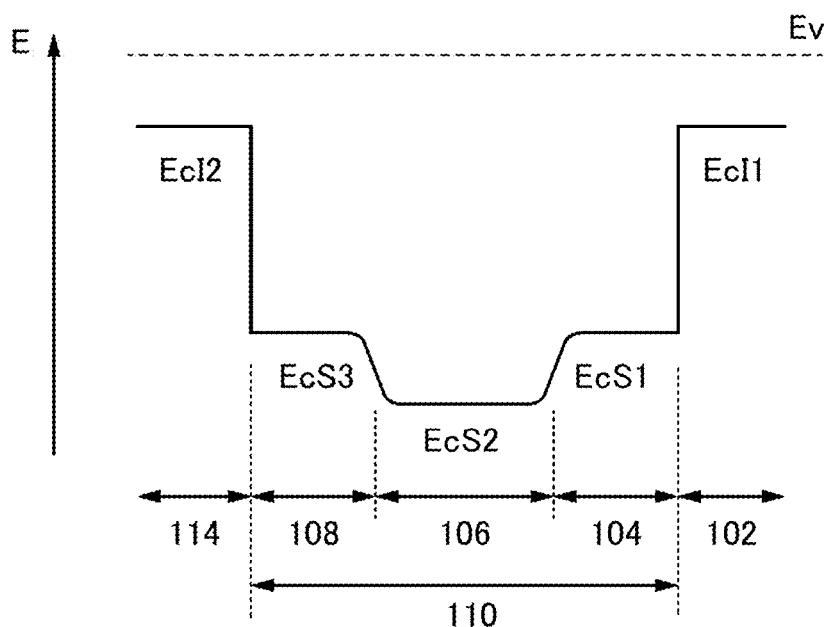
FIG. 2 is a band diagram of stacked layers in a semiconductor device.

Hereinafter, embodiments of the disclosed invention will be described in detail with reference to the accompanying drawings. Note that the invention disclosed in this specification is not limited to the following description, and it is easily understood by those skilled in the art that modes and details of the invention can be modified in various ways. Therefore, the invention disclosed in this specification is not construed as being limited to the description of the following embodiments.

Note that in structures of one embodiment of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in this specification and the like, ordinal numbers such as "first" and "second" are used in order to avoid confusion among components and do not limit the number.

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification.

Embodiment 1

In this embodiment, a semiconductor device of one embodiment of the present invention and a manufacturing method of the semiconductor device will be described with reference to FIGS. 1A to 1C, FIG. 2, FIGS. 3A1, 3A2, 3B1, 3B2, 3C1, and 3C2, FIGS. 4A1, 4A2, 4B1, 4B2, 4C1, and 4C2, FIGS. 5A to 5C, FIGS. 6A to 6C, and FIGS. 7A to 7C. In this embodiment, a fin-type transistor including an oxide semiconductor layer will be described as an example of the semiconductor device.

<Example of Structure of Semiconductor Device>

FIGS. 1A to 1C illustrate a structure of a transistor 200 as an example of a semiconductor device. FIG. 1A is a plan view of the transistor 200, FIG. 1B is a cross-sectional view taken along line V1-W1 in FIG. 1A, and FIG. 1C is a cross-sectional view taken along line X1-Y1 in FIG. 1A. Note that some components of the transistor 200 (e.g., a second oxide layer 108) are omitted in FIG. 1A in order to avoid complexity. The same applies to other plan views.

The transistor 200 illustrated in FIGS. 1A to 1C includes, over a base insulating layer 102 provided over a substrate 100 having an insulating surface, an oxide stack 110 including a first oxide layer 104, an island-shaped oxide semiconductor layer 106 over and in contact with the first oxide layer 104, and the second oxide layer 108 over and in contact with the oxide semiconductor layer 106; a source electrode layer 112a and a drain electrode layer 112b that are electrically connected to the oxide semiconductor layer 106; a gate insulating layer 114 over the second oxide layer 108; and a gate electrode layer 116 overlapping with the oxide semiconductor layer 106 with the gate insulating layer 114 provided therebetween.

As shown in the plan view in FIG. 1A, the oxide semiconductor layer 106 included in the transistor 200 has openings that are placed between the source electrode layer 112a and the drain electrode layer 112b and overlap with the gate electrode layer 116. It is preferable that each opening have a substantially rectangular plane shape and the long-side direction thereof be parallel to the channel length direction. A channel is not formed in the openings where the oxide semiconductor layer 106 is not provided; accordingly, the oxide semiconductor layer 106 includes a plurality of channel formation regions arranged in the channel width direction and parallel to each other. In other words, a channel formation region is divided into the plurality of regions in the channel width direction by the openings in the oxide semiconductor layer 106. Specifically, the oxide semiconductor layer 106 in which the channel is formed includes a first channel formation region 106a with a channel length L and a channel width $W\_1$, a second channel formation region 106b with a channel length L and a channel width $W\_2$, and a third channel formation region 106c with a channel length L and a channel width $W\_3$.

Owing to the openings, the oxide semiconductor layer 106 includes a plurality of strip-like regions parallel to each other with a predetermined interval therebetween and a pair of rectangular regions. One of the pair of rectangular regions is in contact with one end of each of the plurality of strip-like regions, and the other is in contact with the other end of each of the plurality of strip-like regions. The pair of rectangular regions in the oxide semiconductor layer 106 at least partly overlaps with the source electrode layer 112a and the drain electrode layer 112b. Each of the plurality of strip-like regions in the oxide semiconductor layer 106 at least partly overlaps with the gate electrode layer 116.

In the transistor 200, the first oxide layer 104 and the second oxide layer 108 included in the oxide stack 110 are in contact with each other in the openings of the oxide semiconductor layer 106 and in a surrounding area of the island-shaped oxide semiconductor layer 106.

As shown in the cross-sectional view in the channel width direction in FIG. 1B, in the oxide semiconductor layer 106 included in the transistor 200, the gate electrode layer 116 is provided between one channel formation region and the adjacent channel formation region with the gate insulating layer 114 placed between the gate electrode layer 116 and the channel formation regions. In other words, in the channel width direction, the gate electrode layer 116 is provided to cover a side surface and a top surface of each of the first to third channel formation regions 106a to 106c.

Since the gate electrode layer 116 covers the side surface and the top surface of the channel formation region, an electric field of the gate electrode layer 116 can be applied to the channel formation region from the side surface direction as well as from the top surface direction. With such a structure, the electric field can be applied to each channel formation region entirely. This makes it possible to favorably control the threshold voltage of the transistor 200 and improve the S value thereof.

Here, when the channel width of each channel formation region ($W\_1$ to $W\_3$) is too large, it is difficult for the electric field of the gate electrode layer 116 to be applied to the channel formation region from the side surface direction, resulting in low threshold voltage controllability. In order that the electric field of the gate electrode layer 116 is effectively applied to each of the first to third channel formation regions 106a to 106c from the side surface direction, for example, in the case where the thickness of the gate insulating layer 114 is 20 nm, it is preferable to set the channel width of each channel formation region ($W\_1$ to $W\_3$) to greater than or equal to 40 nm and less than or equal to 100 nm. Note that the preferred channel width of each channel formation region ($W\_1$ to $W\_3$) varies depending on the thickness of the gate insulating layer 114; for example, in the case where the thickness of the gate insulating layer 114 is half the above value (10 nm), the preferred range of channel width ($W\_1$ to $W\_3$) is twice the above range (greater than or equal to 80 nm and less than or equal to 200 nm).

On the other hand, when the channel width is made small, the on-state current of the transistor is likely to be reduced. However, the transistor 200 of this embodiment includes the plurality of channel formation regions each having a channel width that allows an electric field to be effectively applied to the channel formation region from the side surface direction, and thus can have increased effective channel width. The transistor 200 can be referred to as a multi-fin-type transistor in which a plurality of fin-type transistors are connected in parallel.

In this embodiment, the transistor 200 includes three channel formation regions: the first to third channel formation regions 106a to 106c. However, one embodiment of the present invention is not limited thereto. The transistor should include at least two channel formation regions, and for example, may include a channel formation region divided into four or more regions.

To increase the on-state current, it is also effective to increase the thickness of the oxide semiconductor layer 106 in which a channel is formed. For example, it is preferable to set the thickness of the oxide semiconductor layer 106 to 10 times to 100 times the channel width ($W\_1$ to $W\_3$), in which case the on-state current of the transistor 200 can be increased. Note that the thickness of the oxide semiconductor layer 106 included in the transistor 200 is not limited to that range.

In the transistor 200 of this embodiment, as illustrated in the plan view in FIG. 1A, the width in the channel width direction of each of the source electrode layer 112a and the drain electrode layer 112b is smaller than that of the island-shaped oxide semiconductor layer 106, and the source electrode layer 112a and the drain electrode layer 112b cover the end portions of the oxide semiconductor layer 106 in the channel length direction. Such a structure can reduce obstruction to electric field application from the gate electrode layer 116 to the side surface of the oxide semiconductor layer 106, and thus can further improve the threshold voltage controllability and the S value of the fin-type transistor.

For the source electrode layer 112a and the drain electrode layer 112b, a conductive material which is easily bonded to oxygen can be preferably used. For example, Al, Cr, Cu, Ta, Ti, Mo, or W can be used. In particular, W with a high melting point is preferred because a relatively high process temperature can be employed in a later step. Note that a conductive material which easily reacts with oxygen includes a material to which oxygen is easily diffused.

When such a conductive material which is easily bonded to oxygen is in contact with the oxide semiconductor layer 106, oxygen in the oxide semiconductor layer 106 is taken into the conductive material. Some heating steps are performed in a manufacturing process of the transistor, and thus oxygen vacancies are generated in regions of the oxide semiconductor layer 106 which are in the vicinity of an interface between the oxide semiconductor layer 106 and each of the source electrode layer 112a and the drain electrode layer 112b, so that n-type regions (indicated by shaded regions in the drawings) are formed. The n-type regions can function as a source and a drain of the transistor 200. Note that the n-type regions can also be formed in the first oxide layer 104 and the second oxide layer 108 in regions in contact with the source electrode layer 112a and the drain electrode layer 112b.

When the transistor 200 includes the n-type regions serving as a source and a drain, current can flow more easily in the on state, resulting in increased on-state current. Particularly in the case where the oxide semiconductor layer 106 is thick, it is effective to provide n-type regions serving as a source and a drain in the end portions of the oxide semiconductor layer 106 in the channel length direction.

Note that a constituent element of the source electrode layer 112a and the drain electrode layer 112b may enter the n-type regions. Further, a region having high oxygen concentration may be formed in part of the source electrode layer 112a and part of the drain electrode layer 112b, which are in contact with the n-type regions. A constituent element of the oxide stack 110 may enter the source electrode layer 112a and the drain electrode layer 112b in contact with the n-type regions in some cases.

In a case of forming a transistor with an extremely short channel length, the n-type regions formed by the generation of the oxygen vacancies sometimes extend in the channel length direction of the transistor. In that case, electrical characteristics of the transistor change; for example, the threshold voltage shifts or on/off of the transistor cannot be controlled with the gate voltage (i.e., the transistor is on). Accordingly, in the case of forming a transistor with an extremely short channel length, it is preferable that a conductive material which is not easily bonded to oxygen be used for the source electrode layer and the drain electrode layer. As the conductive material, for example, tantalum nitride, titanium nitride, or the like is preferably used. Note that the conductive material which is not likely to be bonded to oxygen includes, in its category, a material to which oxygen is not easily diffused.

As described above, the transistor 200 includes the oxide stack 110 including the first oxide layer 104, the oxide semiconductor layer 106, and the second oxide layer 108, between the base insulating layer 102 and the gate insulating layer 114. Each of the first oxide layer 104 and the second oxide layer 108 is an oxide layer containing one or more kinds of metal elements that are contained in the oxide semiconductor layer 106.

The oxide semiconductor layer 106 includes a layer represented by an In-M-Zn oxide, which contains at least indium, zinc, and M (M is a metal element such as Al, Ga, Ge, Y, Zr, Sn, La, Ce, or Hf). The oxide semiconductor layer 106 preferably contains indium because carrier mobility of the transistor can be increased.

The first oxide layer 104 under the oxide semiconductor layer 106 includes an oxide layer which is represented by an In-M-Zn oxide (M is a metal element such as Al, Ti, Ga, Ge, Y, Zr, Sn, La, Ce, or Hf) and which has a higher proportion of M with respect to In in atomic ratio than the oxide semiconductor layer 106. Specifically, the amount of the above element in the first oxide layer 104 in atomic ratio is 1.5 times or more, preferably twice or more, further preferably three times or more as much as that in the oxide semiconductor layer 106 in atomic ratio. The above element is more strongly bonded to oxygen than indium is, and thus has a function of suppressing generation of oxygen vacancies in the oxide layer. That is, oxygen vacancies are less likely to be generated in the first oxide layer 104 than in the oxide semiconductor layer 106.

Further, in a manner similar to the first oxide layer 104, the second oxide layer 108 over the oxide semiconductor layer 106 includes an oxide layer which is represented by an In-M-Zn oxide (M is a metal element such as Al, Ti, Ga, Ge, Y, Zr, Sn, La, Ce, or Hf) and which has a higher proportion of M with respect to In in atomic ratio than the oxide semiconductor layer 106. Specifically, the amount of the above element in the second oxide layer 108 in atomic ratio is 1.5 times or more, preferably twice or more, further preferably three times or more as much as that in the oxide semiconductor layer 106 in atomic ratio. Note that, if the proportion of M with respect to In is too high, the bandgap of the second oxide layer 108 is increased and the second oxide layer 108 might function as an insulating layer. Therefore, it is preferable to adjust the proportion of M such that the second oxide layer 108 functions as a semiconductor layer. Note that the second oxide layer 108 may function as part of the gate insulating layer, depending on the proportion of M.

When each of the first oxide layer 104, the oxide semiconductor layer 106, and the second oxide layer 108 is an In-M-Zn oxide containing at least indium, zinc, and M (M is a metal element such as Al, Ti, Ga, Ge, Y, Zr, Sn, La, Ce, or Hf), and the first oxide layer 104 has an atomic ratio of In to M and Zn which is $x_1:y_1:z_1$, the oxide semiconductor layer 106 has an atomic ratio of In to M and Zn which is $x_2:y_2:z_2$, and the second oxide layer 108 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 106, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

When an In-M-Zn oxide is used for the first oxide layer 104, the proportions of In and M when summation of In and M is assumed to be 100 atomic % are preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. When an In-M-Zn oxide is used for the oxide semiconductor layer 106, the proportions of In and M when summation of In and M is assumed to be 100 atomic % are preferably as follows: the atomic percentage of In is greater than or equal to 25 at. % and the atomic percentage of M is less than 75 at. %; further preferably, the atomic percentage of In is greater than or equal to 34 at. % and the atomic percentage of M is less than 66 at. %. When an In-M-Zn oxide is used for the second oxide layer 108, the proportions of In and M when summation of In and M is assumed to be 100 atomic % are preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %.

The constituent elements of the first oxide layer 104 and the second oxide layer 108 may be different from each other, or their constituent elements may be the same at the same atomic ratios or different atomic ratios.

For the first oxide layer 104, the oxide semiconductor layer 106, and the second oxide layer 108, an oxide semiconductor containing indium, zinc, and gallium can be used, for example.

The first oxide layer 104 preferably has a thickness large enough to prevent trap states that can be generated at the interface between the base insulating layer 102 and the first oxide layer 104 from affecting the channel. However, since the first oxide layer 104 is the path of oxygen from the base insulating layer 102 to the oxide semiconductor layer 106, an excessively large thickness of the first oxide layer 104 inhibits the supply of oxygen and is unpreferable.

Furthermore, the thickness of the second oxide layer 108 is the thickness that prevents a constituent element of the gate insulating layer 114 that serves as an impurity in the oxide semiconductor from entering the oxide semiconductor layer 106. Since the second oxide layer 108 is provided between the gate electrode layer 116 and the oxide semiconductor layer 106 serving as a channel, the thickness of the second oxide layer 108 is preferably as small as possible for an increase in the on-state current of the transistor. Specifically, the thickness of the second oxide layer 108 is, for example, greater than or equal to 0.3 nm and less than 10 nm, preferably greater than or equal to 0.3 nm and less than or equal to 5 nm.

Preferably, each of the first oxide layer 104 and the second oxide layer 108 is formed of an oxide semiconductor which contains one or more kinds of the metal elements contained in the oxide semiconductor layer 106 and has an energy at the conduction band minimum that is closer to the vacuum level than that of the oxide semiconductor layer 106 by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode layer 116 in such a structure, a channel is formed in the oxide semiconductor layer 106 that is the layer having the lowest conduction band minimum in the stacked structure including the oxide semiconductor layer. Accordingly, the second oxide layer 108 formed between the oxide semiconductor layer 106 and the gate insulating layer 114 enables prevention of the contact between the channel of the transistor and the gate insulating layer 114.

In addition, the oxide layers in which oxygen vacancies are less likely to be generated than in the oxide semiconductor layer 106 are provided in contact with an upper surface and a lower surface of the oxide semiconductor layer 106 where the channel is formed, whereby generation of oxygen vacancies in the channel of the transistor can be suppressed.

<Band Structure of Stacked Layers in Transistor>

Here, a band structure of the base insulating layer 102, the first oxide layer 104, the oxide semiconductor layer 106, the second oxide layer 108, and the gate insulating layer 114 in the transistor 200 will be described with reference to FIG. 2.

In FIG. 2, EcI1, EcS1, EcS2, EcS3, and EcI2 schematically represent energies at the conduction band minimum of the base insulating layer 102, the first oxide layer 104, the oxide semiconductor layer 106, the second oxide layer 108, and the gate insulating layer 114, respectively. Note that the thicknesses of the layers in FIGS. 1A to 1C are not considered here for convenience.

Here, an energy difference between the vacuum level and the conduction band minimum (this difference is also referred to as electron affinity) corresponds to a value obtained by subtracting an energy gap from an energy difference between the vacuum level and the valence band maximum (this difference is also referred to as an ionization potential). Note that the energy gap can be measured using a spectroscopic ellipsometer (e.g., UT-300 manufactured by HORIBA JOBIN YVON SAS.). Note that the energy difference between the vacuum level and the valence band maximum can be measured using an ultraviolet photoelectron spectroscopy (UPS) device (e.g., VersaProbe manufactured by ULVAC-PHI, Inc.).

As shown in FIG. 2, energy at the conduction band minimum continuously changes from the first oxide layer 104 through the oxide semiconductor layer 106 to the second oxide layer 108, without an energy barrier therebetween. This is presumably because the compositions of the first oxide layer 104, the oxide semiconductor layer 106, and the second oxide layer 108 are close to each other and therefore oxygen easily diffuses among the layers to form a mixed layer.

Although the case where the first oxide layer 104 and the second oxide layer 108 are oxide layers having the same energy gap is shown in FIG. 2, the first oxide layer 104 and the second oxide layer 108 may be oxide layers having different energy gaps.

It can be noticed from FIG. 2 that the oxide semiconductor layer 106 serves as a well in the oxide stack 110 including the oxide semiconductor layer 106, and a channel is thus formed in the oxide semiconductor layer 106 in the transistor including the oxide stack 110. Note that since the energy at the conduction band minimum is changed continuously in the oxide stack 110, the structure of the oxide stack 110 can also be referred to as a U-shaped well. Further, a channel formed by such a structure can also be referred to as a buried channel.

Since each of the first oxide layer 104 and the second oxide layer 108 is an oxide layer containing one or more kinds of the metal elements that are contained in the oxide semiconductor layer 106, the stacked structure including these layers can also be referred to as an oxide stack in which oxide layers containing the same main components are stacked. The oxide stack in which oxide layers containing the same main components are stacked is formed not simply by stacking layers but to have a continuous junction (here, in particular, a U-shaped well structure in which energy of the conduction band minimum is changed continuously between the layers). This is because when impurities which form a defect state such as a trap center or a recombination center are mixed at each interface, the continuity of the energy band is lost, and thus carriers are trapped or disappear by recombination at the interface.

To form a continuous junction, it is necessary to stack the layers in succession without exposure to the air using a multi-chamber deposition apparatus (sputtering apparatus) provided with load lock chambers. Each chamber of the sputtering apparatus is preferably evacuated to a high vacuum (to about $5\times10^{-7}$ Pa to $1\times10^{-4}$ Pa) by an entrapment vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a highly purified intrinsic oxide semiconductor. An oxygen gas or an argon gas used as the sputtering gas is preferably highly purified to have a dew point of $-40°$ C. or lower, preferably $-80°$ C. or lower, further preferably $-100°$ C. or lower, whereby entry of moisture or the like into the oxide semiconductor can be prevented as much as possible.

The first oxide layer 104 and the second oxide layer 108 which are provided over and under the oxide semiconductor layer 106 each serve as a barrier layer and can prevent trap states formed at an interface between the oxide stack 110 and each of the insulating layers that are in contact with the oxide stack 110 (the base insulating layer 102 and the gate insulating layer 114) from adversely affecting the oxide semiconductor layer 106 that serves as a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. In the transistor 200 of this embodiment, the oxide layers in which oxygen vacancies are less likely to be generated than in the oxide semiconductor layer 106 are provided in contact with the upper surface and the lower surface of the oxide semiconductor layer 106, whereby oxygen vacancies in the oxide semiconductor layer 106 can be reduced. For example, the absorption coefficient due to the localized states of the oxide semiconductor layer 106, which is obtained by measurement by a constant photocurrent method (CPM), can be lower than $1\times10^{-3}$/cm, preferably lower than $1\times10^{-4}$/cm.

In addition, when the oxide semiconductor layer 106 is in contact with an insulating layer including a different constituent element (e.g., a base insulating layer including a silicon oxide film), an interface state is sometimes formed at the interface of the two layers and the interface state forms a channel. At this time, in some cases, a second transistor having a different threshold voltage may be formed and accordingly an apparent threshold voltage of the transistor may fluctuate. However, since the first oxide layer 104 contains one or more kinds of the metal elements that are contained in the oxide semiconductor layer 106 in the transistor 200 of this embodiment, an interface state is less likely to be formed at the interface between the first oxide layer 104 and the oxide semiconductor layer 106. Thus, with the first oxide layer 104, variations in electrical characteristics of the transistors, such as a threshold voltage, can be reduced.

When a channel is formed at an interface between the gate insulating layer 114 and the oxide semiconductor layer 106, interface scattering occurs at the interface and the field-effect mobility of the transistor is decreased. However, since the second oxide layer 108 contains one or more kinds of the metal elements that are contained in the oxide semiconductor layer 106 in the transistor 200 of this embodiment, scattering of carriers is less likely to occur at an interface between the oxide semiconductor layer 106 and the second oxide layer 108, and thus the field-effect mobility of the transistor can be increased.

Further, the first oxide layer 104 and the second oxide layer 108 each also serve as a barrier layer which suppresses formation of an impurity state due to the entry of the constituent elements of the base insulating layer 102 and the gate insulating layer 114 into the oxide semiconductor layer 106.

For example, in the case of using a silicon-containing insulating layer as each of the base insulating layer 102 and the gate insulating layer 114 which are in contact with the first oxide layer 104 and the second oxide layer 108 respectively, silicon in the insulating layers or carbon which might be contained in the insulating layers enters the first oxide layer 104 or the second oxide layer 108 to a depth of several nanometers from the interface in some cases. If an impurity such as silicon or carbon enters the oxide semiconductor layer, impurity states may be formed, and these impurity states cause generation of electrons, so that the oxide semiconductor layer may become n-type.

However, when the thickness of the first oxide layer 104 and the second oxide layer 108 is larger than several nanometers, the impurity such as silicon or carbon does not reach the oxide semiconductor layer 106, so that the influence of impurity states is suppressed.

Note that in order to make the oxide semiconductor layer 106 intrinsic or substantially intrinsic, the concentration of silicon in the oxide semiconductor layer 106, which is measured by SIMS, is set to be lower than $1\times10^{19}$ atoms/cm$^3$, preferably lower than $5\times10^{18}$ atoms/cm$^3$, further preferably lower than $3\times10^{18}$ atoms/cm$^3$, still further preferably lower than $1\times10^{18}$ atoms/cm$^3$. The concentration of hydrogen is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Note that the impurity concentrations of the oxide semiconductor layer can be measured by secondary ion mass spectrometry (SIMS).

In the case where the oxide semiconductor layer 106 includes crystals, high concentration of silicon or carbon might reduce the crystallinity of the oxide semiconductor layer 106. In order not to lower the crystallinity of the oxide semiconductor layer 106, the concentration of silicon in the oxide semiconductor layer 106 is set to be lower than $1\times10^{19}$ atoms/cm$^3$, preferably lower than $5\times10^{18}$ atoms/cm$^3$, further preferably lower than $1\times10^{18}$ atoms/cm$^3$. Moreover, the concentration of carbon is set to be lower than $1\times10^{19}$ atoms/cm$^3$, preferably lower than $5\times10^{18}$ atoms/cm$^3$, further preferably lower than $1\times10^{18}$ atoms/cm$^3$.

A transistor in which the highly purified oxide semiconductor layer 106 is used for a channel formation region has an extremely low off-state current. For example, the drain current when the transistor including a highly purified oxide semiconductor layer is in an off state can be $1\times10^{-18}$ A or lower, preferably $1\times10^{-21}$ A or lower, further preferably $1\times10^{-24}$ A or lower at room temperature (approximately 25° C.), or the drain current can be $1\times10^{-15}$ A or lower, preferably $1\times10^{-18}$ A or lower, further preferably $1\times10^{-21}$ A or lower at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

<Method for Manufacturing Semiconductor Device>

A method for manufacturing the transistor 200 illustrated in FIGS. 1A to 1C will be described with reference to FIGS. 3A1, 3A2, 3B1, 3B2, 3C1, and 3C2 and FIGS. 4A1, 4A2, 4B1, 4B2, 4C1, and 4C2.

Note that FIGS. 3A1, 3A2, 4A1, and 4A2 are plan views of the transistor 200 being manufactured. FIGS. 3B1, 3B2, 4B1, and 4B2 are cross-sectional views taken along V1-W1 in the respective plan views. FIGS. 3C1, 3C2, 4C1, and 4C2 are cross-sectional views taken along X1-Y1 in the respective plan views. For example, FIG. 3B1 is a cross-sectional view taken along V1-W1 in FIG. 3A1, and FIG. 3C1 is a cross-sectional view taken along X1-Y1 in FIG. 3A1.

First, the base insulating layer 102 is formed over the substrate 100 having an insulating surface.

The substrate 100 is not limited to a simple supporting substrate, and may be a substrate where a device such as a transistor is formed. In that case, at least one of the gate electrode layer 116, the source electrode layer 112a, and the drain electrode layer 112b of the transistor 200 may be electrically connected to the above device.

The base insulating layer 102 has a function of supplying oxygen to the first oxide layer 104 and/or the oxide semiconductor layer 106 which is formed later as well as a function of preventing diffusion of an impurity from the substrate 100. Therefore, an insulating layer containing oxygen is used as the base insulating layer 102. Further, the base insulating layer 102 is preferably a layer containing excess oxygen. The supply of oxygen from the base insulating layer 102 can reduce oxygen vacancies in the oxide semiconductor layer 106. The base insulating layer 102 may have a single-layer structure or a stacked structure. Note that the base insulating layer 102 can be formed by a sputtering method, a plasma chemical vapor deposition (CVD) method, a thermal CVD method such as a metal organic chemical vapor deposition (MOCVD) method or an atomic layer deposition (ALD) method, or the like.

Note that in the case where the substrate 100 is a substrate where another device is formed as described above, the base insulating layer 102 also has a function as an interlayer insulating film. In that case, the base insulating layer 102 is preferably subjected to planarization treatment such as chemical mechanical polishing (CMP) treatment so as to have a flat surface.

In the transistor 200 of this embodiment, the base insulating layer 102 containing oxygen is provided below the stacked structure including the oxide semiconductor layer, which is formed later. With this structure, oxygen contained in the base insulating layer 102 can be supplied to a channel formation region. The base insulating layer 102 preferably includes a region containing oxygen in excess of the stoichiometric composition. When the base insulating layer 102 contains excess oxygen, supply of oxygen to the channel formation region is promoted.

Note that in this specification and the like, excess oxygen means oxygen which can be transferred in an oxide semiconductor layer, silicon oxide, or silicon oxynitride by heat treatment, oxygen which exists in excess of the intrinsic stoichiometric composition, or oxygen having a function of filling Vo (oxygen vacancies) generated due to lack of oxygen.

In order to make the base insulating layer 102 contain excess oxygen, the base insulating layer 102 may be formed in an oxygen atmosphere, for example. Alternatively, the base insulating layer 102 may be made to contain excess oxygen in such a manner that oxygen is introduced into the deposited base insulating layer 102. Further alternatively, both of these methods may be combined.

The base insulating layer 102 is an insulating layer in contact with the first oxide layer 104 and thus it is preferable that the hydrogen concentration in the base insulating layer 102 be reduced. After the formation of the base insulating layer 102, it is preferable to perform heat treatment (dehydration treatment or dehydrogenation treatment) for the purpose of hydrogen removal.

The heat treatment is performed at a temperature higher than or equal to 250° C. and lower than or equal to 650° C., preferably higher than or equal to 350° C. and lower than or equal to 600° C., or lower than the strain point of the substrate. For example, the substrate is put in an electric furnace which is one of heat treatment apparatuses, and the heat treatment is performed on the base insulating layer 102 at 450° C. in a vacuum (reduced-pressure) atmosphere for an hour.

Note that the heat treatment apparatus is not limited to an electric furnace, and an apparatus for heating an object by thermal conduction or thermal radiation from a heating element such as a resistance heating element may be used. For example, an RTA (rapid thermal annealing) apparatus such as a GRTA (gas rapid thermal annealing) apparatus or an LRTA (lamp rapid thermal annealing) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the high-temperature gas, an inert gas that does not react with an object by heat treatment, such as nitrogen or a rare gas such as argon is used. Note that in the case where a GRTA apparatus is used as the heat treatment apparatus, the substrate may be heated in an inert gas heated to a high temperature of higher than or equal to 650° C. and lower than or equal to 700° C. because the heat treatment time is short.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). Note that it is preferable that water, hydrogen, or the like be not contained in the atmosphere of nitrogen, oxygen, ultra-dry air, or a rare gas. The purity of nitrogen, oxygen, or a rare gas which is introduced into a heat treatment apparatus is preferably 6N (99.9999%) or higher, further preferably 7N (99.99999%) or higher (that is, the impurity concentration is preferably 1 ppm or lower, further preferably 0.1 ppm or lower).

Note that oxygen can be released from the base insulating layer 102 by heat treatment. Accordingly, treatment for introducing oxygen (at least including any of oxygen radicals, ozone, oxygen atoms, and oxygen ions (including oxygen molecular ions and oxygen cluster ions)) to the dehydrated or dehydrogenated base insulating layer 102 is preferably performed.

The introduction of oxygen to the base insulating layer 102 can be performed by an ion implantation method, an ion doping method, a plasma immersion ion implantation method, plasma treatment, or the like, for example. A gas containing oxygen can be used for the oxygen introduction treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment. By the oxygen introduction treatment on the base insulating layer 102, oxygen that is released by heat treatment can be compensated.

Next, the first oxide layer 104 and the oxide semiconductor layer 106 are formed over the base insulating layer 102 by a sputtering method, a CVD method, a molecular beam epitaxy (MBE) method, an ALD method, or a pulse laser deposition (PLD) method.

The first oxide layer 104 and the oxide semiconductor layer 106 can be formed using the above-described materials.

For example, when the first oxide layer 104 is formed by a sputtering method, a sputtering target with a composition of In:Ga:Zn=1:3:2 in atomic ratio, a sputtering target with a composition of In:Ga:Zn=1:6:4 in atomic ratio, a sputtering target with a composition of In:Ga:Zn=1:9:6 in atomic ratio, or a sputtering target having a composition that is in the neighborhood of the compositions of the above targets is preferably used.

For example, when the oxide semiconductor layer 106 is formed by a sputtering method, a sputtering target with a composition of In:Ga:Zn=1:1:1 in atomic ratio, a sputtering target with a composition of In:Ga:Zn=3:1:2 in atomic ratio, or a sputtering target having a composition that is in the neighborhood of the compositions of the above targets is preferably used.

Note that the composition of the film formed by a sputtering method may be different from the composition of the target for forming the film. For example, when an oxide semiconductor layer is formed using a sputtering target including ZnO, sublimation of ZnO or the like may occur during deposition, so that the atomic ratio of Zn to In and/or Ga in the deposited oxide semiconductor layer becomes lower than that of the sputtering target.

As described above, a material of the first oxide layer 104 is selected such that the first oxide layer 104 has a lower electron affinity than the oxide semiconductor layer 106.

The first oxide semiconductor layer 104 and the oxide semiconductor layer 106 are preferably formed by a sputtering method. As the sputtering method, an RF sputtering method, a DC sputtering method, an AC sputtering method, or the like can be used. In particular, a DC sputtering method is preferably used because dust generated in the deposition can be reduced and the film thickness can be uniform.

In the formation of the first oxide layer 104 and the oxide semiconductor layer 106, the hydrogen concentrations in the first oxide layer 104 and the oxide semiconductor layer 106 are preferably reduced as much as possible. To reduce the hydrogen concentration, for example, in the case where the first oxide layer 104 and the oxide semiconductor layer 106 are formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a deposition chamber of a sputtering apparatus.

The first oxide layer 104 and the oxide semiconductor layer 106 are formed in such a manner that a sputtering gas from which hydrogen and moisture are removed is introduced into a deposition chamber while moisture remaining in the deposition chamber is removed, whereby the concentration of hydrogen in the first oxide layer 104 and the oxide semiconductor layer 106 can be reduced. In order to remove the residual moisture in the deposition chamber, an entrapment vacuum pump, for example, a cryopump, an ion pump, or a titanium sublimation pump is preferably used. The evacuation unit may be a turbo molecular pump provided with a cold trap. When the deposition chamber is evacuated with the cryopump, which has a high capability in removing a hydrogen molecule, a compound containing a hydrogen atom such as water ($H_2O$) (preferably, also a compound containing a carbon atom), and the like, the impurity concentration in the oxide layer and the oxide semiconductor layer formed in the deposition chamber can be reduced.

Note that oxygen may be introduced into the first oxide layer 104 at the timing that is after formation of the first oxide layer 104 and before formation of the oxide semiconductor layer 106. By the oxygen introduction treatment, the first oxide layer 104 contains excess oxygen, so that the excess oxygen can be supplied to the oxide semiconductor layer 106 by heat treatment in a later film formation step.

It is preferable to perform heat treatment after the formation of the first oxide layer 104 and the oxide semiconductor layer 106. The heat treatment is preferably performed at a temperature of higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By this heat treatment, impurities such as hydrogen or water can be removed from at least one of the base insulating layer 102, the first oxide layer 104, and the oxide semiconductor layer 106. Note that the above-described heat treatment may be performed after the oxide semiconductor layer 106 is processed into an island shape.

Next, the oxide semiconductor layer 106 is patterned into the island-shaped oxide semiconductor layer 106 having openings (see FIGS. 3A1, 3B1, and 3C1). Note that each opening is selectively formed in a region that is to overlap with the gate electrode layer 116.

When the oxide semiconductor layer 106 is processed by etching, a part of the first oxide layer 104 (a region not covered with the island-shaped oxide semiconductor layer 106) might be etched to be thinned because of overetching of the oxide semiconductor layer 106.

Then, the second oxide layer 108 is formed over the first oxide layer 104 to cover the side surface and the top surface of the island-shaped oxide semiconductor layer 106 (see FIGS. 3A2, 3B2, and 3C2). Note that the second oxide layer 108 can be formed by a sputtering method, a plasma CVD method, a thermal CVD method such as a MOCVD method or an ALD method, or the like. In the above manner, the oxide stack 110 is formed.

For the second oxide layer 108, the above-described material can be used. For example, when the second oxide layer 108 is formed by a sputtering method, a sputtering target with a composition of In:Ga:Zn=1:3:2 in atomic ratio, a sputtering target with a composition of In:Ga:Zn=1:6:4 in atomic ratio, a sputtering target with a composition of In:Ga:Zn=1:9:6 in atomic ratio, or a sputtering target having a composition that is in the neighborhood of the compositions of the above targets is preferably used.

Note that a mixed layer (or a mixed region) of the oxide semiconductor layer 106 and the second oxide layer 108 may be formed at the interface therebetween. In that case, in the transistor 200, the interface between the oxide semiconductor layer 106 and the second oxide layer 108 is unclear in some cases. The mixed layer (or the mixed region) at the interface can reduce interface scattering between the oxide semiconductor layer 106 and the second oxide layer 108. The same applies to the interface between the oxide semiconductor layer 106 and the first oxide layer 104.

Heat treatment may be performed after the formation of the second oxide layer 108. The heat treatment can be performed under conditions similar to those for the heat treatment performed after the formation of the first oxide layer 104 and the oxide semiconductor layer 106.

Then, a conductive film is formed over the second oxide layer 108 and is processed to form the source electrode layer 112a and the drain electrode layer 112b (see FIGS. 4A1, 4B1, and 4C1). Note that the source electrode layer 112a and the drain electrode layer 112b can be formed by a sputtering method, a plasma CVD method, a thermal CVD method such as a MOCVD method or an ALD method, or the like.

Although not shown, the source electrode layer 112a and the drain electrode layer 112b may have a step-like end portion with a plurality of steps. The end portion can be processed by alternately performing a step of making a resist mask recede by ashing and an etching step a plurality of times. It is preferable that the number of steps be increased as the thickness of the source electrode layer 112a and the drain electrode layer 112b is increased.

When the source electrode layer 112a and the drain electrode layer 112b have a shape including a plurality of steps as described above, coverage with the films formed over the source electrode layer 112a and the drain electrode layer 112b, specifically, coverage with the gate insulating layer 114 and the like is improved, so that the transistor can have more favorable electrical characteristics and higher long-term reliability.

When the conductive film is processed into the source electrode layer 112a and the drain electrode layer 112b, a part of the second oxide layer 108 (regions that are not covered with the source electrode layer 112a and the drain electrode layer 112b) might be etched to be thinned because of overetching of the conductive film.

Next, the gate insulating layer 114 is formed over the source electrode layer 112a and the drain electrode layer 112b by a sputtering method, an MBE method, a CVD method, a PLD method, an ALD method, or the like.

The gate insulating layer 114 can be formed using a silicon oxide film, a gallium oxide film, an aluminum oxide film, a silicon nitride film, a silicon oxynitride film, an aluminum oxynitride film, a silicon nitride oxide film, or the like. The gate insulating layer 114 is preferably a film containing oxygen because it can supply oxygen to the second oxide layer 108 or the oxide semiconductor layer 106. In addition, as a material of the gate insulating layer 114, hafnium oxide, yttrium oxide, hafnium silicate (Hf-Si$_x$O$_y$ (x>0, y>0)), hafnium silicate to which nitrogen is added, hafnium aluminate (HfAl$_x$O$_y$ (x>0, y>0)), or lanthanum oxide may be used. The gate insulating layer 114 may have either a single-layer structure or a stacked structure.

For example, the gate insulating layer 114 is preferably formed by a high-density plasma CVD method using microwave (e.g., a frequency of 2.45 GHz), whereby the gate insulating layer 114 can be formed dense with high withstand voltage.

Next, the gate electrode layer 116 is formed over the gate insulating layer 114 (see FIGS. 4A2, 4B2, and 4C2).

The gate electrode layer 116 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 116. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, the gate electrode layer 116 can have a stacked structure of the above conductive material and the above metal material.

The gate electrode layer 116 can have a single-layer structure or a stacked-layer structure. As one layer of the gate electrode layer 116 that is in contact with the gate insulating layer 114, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. Such a film has a work function of higher than or equal to 5 eV, preferably higher than or equal to 5.5 eV, and the use of this film as the gate electrode layer enables the threshold voltage of the transistor to be shifted in the positive direction. Accordingly, a normally-off switching element can be obtained.

The gate electrode layer 116 can be formed by a plasma CVD method, a sputtering method, a thermal CVD method such as a MOCVD method or an ALD method, or the like.

Heat treatment may be performed after the formation of the gate insulating layer 114 and/or after the formation of the gate electrode layer 116. The heat treatment can be performed under conditions similar to those for the heat treatment performed after the formation of the first oxide layer 104 and the oxide semiconductor layer 106.

Through the above steps, the transistor 200 of this embodiment can be formed.

After the formation of the gate electrode layer 116, an insulating layer may be formed over the gate electrode layer 116. The insulating layer can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Note that the insulating layer may be a stacked layer of any of the above materials. The insulating layer can be formed by a sputtering method, a CVD method, an MBE method, an ALD method, a PLD method, or the like.

For example, as the insulating layer over the gate electrode layer 116, a layer having a low oxygen permeability (having an oxygen barrier property) may be used. Examples of a material for the layer with a low oxygen permeability include aluminum oxide and nitrides such as silicon nitride and silicon nitride oxide. By providing the insulating layer with a low oxygen permeability over the gate electrode layer 116 to cover the gate insulating layer 114, oxygen that will be released from the base insulating layer 102 or the like by heat treatment performed later can be prevented from being released outside and the oxygen can be supplied to the oxide stack 110 effectively.

Alternatively, a stacked-layer structure of a layer containing oxygen that may serve as a supply source of oxygen to the oxide stack 110 (i.e., containing excess oxygen) and a layer with a low oxygen permeability may be formed as the insulating layer over the gate electrode layer 116.

After the formation of the insulating layer over the gate electrode layer 116, heat treatment may be performed. The heat treatment can be performed under conditions similar to those for the heat treatment performed after the formation of the first oxide layer 104 and the oxide semiconductor layer 106.

As described above, the transistor of this embodiment includes the plurality of channel formation regions. In the transistor, the gate electrode layer covers the side surface and the top surface of each channel formation region. The electric field of the gate electrode layer is applied to each channel formation region from the side surface direction as well as from the top surface direction. This makes it possible to favorably control the threshold voltage of the transistor and improve the S value thereof. Moreover, with the plurality of channel formation regions having such structures, the transistor can have increased effective channel width; thus, the on-state current of the transistor can be increased.

Further, the transistor of this embodiment includes an oxide layer between the oxide semiconductor layer where a channel is formed and an insulating layer that overlaps with the oxide semiconductor layer. The oxide layer contains at least one of metal elements contained in the oxide semiconductor layer. When the oxide semiconductor layer is in contact with the insulating layer, a trap state can be formed at the interface between the oxide semiconductor layer and the insulating layer. The above structure including the oxide layer between the oxide semiconductor layer and the insulating layer suppresses formation of the trap state and thus can prevent deterioration of electrical characteristics of the transistor.

Modification Example 1 of Semiconductor Device

FIGS. 5A to 5C illustrate a modification example having a structure partly different from that of the transistor 200 in FIGS. 1A to 1C. FIG. 5A is a plan view of a transistor 210, FIG. 5B is a cross-sectional view of the transistor 210 taken along line V2-W2 in FIG. 5A, and FIG. 5C is a cross-sectional view of the transistor 210 taken along line X2-Y2 in FIG. 5A.

In the oxide stack 110 of the transistor 210 illustrated in FIGS. 5A to 5C, the second oxide layer 108 is formed over the source electrode layer 112a and the drain electrode layer 112b to be in contact with the oxide semiconductor layer 106 not covered with the source electrode layer 112a and the drain electrode layer 112b. Accordingly, in the transistor 210, the source electrode layer 112a and the drain electrode layer 112b are provided in contact with side surfaces of the first oxide layer 104 and side surfaces and part of top surfaces of the oxide semiconductor layer 106, and n-type regions are formed in regions where the source electrode layer 112a and the drain electrode layer 112b are in contact with the oxide semiconductor layer 106. Note that the n-type regions can also be formed in the first oxide layer 104 and the second oxide layer 108 in regions in contact with the source electrode layer 112a and the drain electrode layer 112b.

The first oxide layer 104 is etched in the etching step of the oxide semiconductor layer 106 using the same mask. That is, in the transistor 210, the first oxide layer 104 and the oxide semiconductor layer 106 have the same plane shape and, in the cross section, the upper edge of the first oxide layer 104 coincides with the lower edge of the oxide semiconductor layer 106.

In the transistor 210, the second oxide layer 108 and the gate insulating layer 114 are etched in a self-aligned manner with the gate electrode layer 116 used as a mask. In other words, the second oxide layer 108, the gate insulating layer 114, and the gate electrode layer 116 have the same plane shapes in the transistor 210.

In this specification and the like, the term "the same" or "coincide" does not necessarily mean exactly being the same or exactly coinciding and include the meaning of being substantially the same or substantially coinciding. For example, shapes obtained by etching using the same mask are expressed as being the same or coinciding with each other.

The other components of the transistor 210 are similar to those of the transistor 200; thus, detailed description thereof is omitted here.

As shown in FIG. 5B, in the transistor 210, since the first oxide layer 104 and the oxide semiconductor layer 106 are processed using the same mask, the second oxide layer 108 is in contact with the base insulating layer 102 in a region between one channel formation region and the adjacent channel formation region. As compared with the transistor 200 in which the second oxide layer 108 is in contact with the first oxide layer 104 in the region, with such a structure, the gate electrode layer 116 provided in the region can be close to the lower end of the channel formation region in the thickness direction (the interface between the channel formation region and the first oxide layer 104).

Therefore, in the transistor 210, an electric field can be applied from the gate electrode layer 116 to a wider region, which makes it possible to favorably control the threshold voltage of the transistor and improve the S value thereof.

When the oxide semiconductor layer 106 and the first oxide layer 104 are processed by etching, a part of the base insulating layer 102 (a region not covered with the island-shaped oxide semiconductor layer 106 and first oxide layer 104) might be etched to be thinned because of overetching of the first oxide layer 104. In that case, the gate electrode layer 116 provided in the region between one channel formation region and the adjacent channel formation region can be even closer to the lower end of the channel formation region in the thickness direction (the interface between the channel formation region and the first oxide layer 104).

Since the second oxide layer 108 is processed using the gate electrode layer 116 as a mask, outward diffusion of indium contained in the second oxide layer 108 can be prevented. The outward diffusion of indium is a factor causing variations in electrical characteristics of transistors or a factor of contamination in a deposition chamber in the process. Thus, processing the second oxide layer 108 using the gate electrode layer 116 as a mask is effective.

The mask used for processing the oxide semiconductor layer 106 can be used for processing the first oxide layer 104, and the gate electrode layer 116 can be used as a mask for processing the second oxide layer 108; thus, the transistor 210 can be manufactured without an increase in the number of masks as compared with the process for manufacturing the transistor 200, which is preferable.

Modification Example 2 of Semiconductor Device

FIGS. 6A to 6C illustrate a modification example having a structure partly different from that of the transistor 200 in FIGS. 1A to 1C. FIG. 6A is a plan view of a transistor 220, FIG. 6B is a cross-sectional view of the transistor 220 taken along line V3-W3 in FIG. 6A, and FIG. 6C is a cross-sectional view of the transistor 220 taken along line X3-Y3 in FIG. 6A.

In the transistor 220 shown in FIGS. 6A to 6C, the first oxide layer 104, the oxide semiconductor layer 106, and the second oxide layer 108 in the oxide stack 110 are etched using the same mask. That is, in the transistor 220, the first oxide layer 104, the oxide semiconductor layer 106, and the second oxide layer 108 have the same plane shape and, in the cross section, the upper edge of the first oxide layer 104 coincides with the lower edge of the oxide semiconductor layer 106, and the upper edge of the oxide semiconductor layer 106 coincides with the lower edge of the second oxide layer 108.

Accordingly, in the transistor 220, the source electrode layer 112a and the drain electrode layer 112b are provided in contact with side surfaces of the first oxide layer 104, side surfaces of the oxide semiconductor layer 106, and side surfaces and part of top surfaces of the second oxide layer 108.

The other components of the transistor 220 are similar to those of the transistor 200; thus, detailed description thereof is omitted here.

As shown in FIG. 6B, in the transistor 220, since the first oxide layer 104, the oxide semiconductor layer 106, and the second oxide layer 108 are processed using the same mask, the gate insulating layer 114 is in contact with the base insulating layer 102 in a region between one channel formation region and the adjacent channel formation region. With such a structure, the gate electrode layer 116 provided in the region can be closer to the lower end of the channel formation region in the thickness direction (the interface between the channel formation region and the first oxide layer 104) than in the transistor 210.

Therefore, in the transistor 220, an electric field can be applied from the gate electrode layer 116 to an even wider region, which makes it possible to favorably control the threshold voltage of the transistor and improve the S value thereof.

As in the transistor 210, when the oxide stack 110 is processed by etching, a part of the base insulating layer 102 (a region not covered with the island-shaped second oxide layer 108, oxide semiconductor layer 106, and first oxide layer 104) might be etched to be thinned because of over-etching of the first oxide layer 104. In that case, the gate electrode layer 116 provided in the region between one channel formation region and the adjacent channel formation region can be even closer to the lower end of the channel formation region in the thickness direction (the interface between the channel formation region and the first oxide layer 104).

Note that in the transistor 220, in the channel width direction, the gate insulating layer 114 is in contact with the oxide semiconductor layer 106 where a channel is formed. In the case where the above material having a high proportion of M and thus exhibiting an insulating property is used for the second oxide layer 108, the gate insulating layer thickness is increased owing to the second oxide layer 108. Even in that case, electric field application to the channel formation region from the side surface direction is hardly inhibited in the transistor 220.

In the transistor 220, the first oxide layer 104, the oxide semiconductor layer 106, and the second oxide layer 108 can be patterned using the same mask. Thus, the transistor 220 can be manufactured without an increase in the number of masks as compared with the process for manufacturing the transistor 200, which is preferable.

Modification Example 3 of Semiconductor Device

FIGS. 7A to 7C illustrate a modification example having a structure partly different from that of the transistor 200 in FIGS. 1A to 1C. FIG. 7A is a plan view of a transistor 230, FIG. 7B is a cross-sectional view of the transistor 230 taken along line V4-W4 in FIG. 7A, and FIG. 7C is a cross-sectional view of the transistor 230 taken along line X4-Y4 in FIG. 7A.

The transistor 230 shown in FIGS. 7A to 7C includes a gate electrode layer 103 under the first oxide layer 104 with the base insulating layer 102 provided therebetween. The oxide semiconductor layer 106 overlaps with the gate electrode layer 103. The gate electrode layer 103 can serve as what is called a back gate electrode. In the transistor 230, the base insulating layer 102 also serves as a gate insulating layer.

The gate electrode layer 116 of the transistor 230 is provided so as not to overlap with the source electrode layer 112a and the drain electrode layer 112b. Such a structure can reduce parasitic capacitance between the gate electrode layer 116 and the source electrode layer 112a and between the gate electrode layer 116 and the drain electrode layer 112b.

The other components of the transistor 230 are similar to those of the transistor 200; thus, detailed description thereof is omitted here.

Since the transistor 230 includes the gate electrode layer 103 serving as a back gate electrode below the oxide semiconductor layer 106, an electric field can be effectively applied to the lower end of the channel formation region in the thickness direction (the interface between the channel formation region and the first oxide layer 104), where electric field application is difficult only with the gate electrode layer 116. Accordingly, an electric field can be applied to the channel formation region in the oxide semiconductor layer 106 included in the transistor 230 entirely in the side surface directions and the top and bottom directions. This makes it possible to favorably control the threshold voltage of the transistor and improve the S value thereof.

The material and the formation method used for the gate electrode layer 116 can be referred to for a material and a formation method used for the gate electrode layer 103.

The base insulating layer 102 serving as a gate insulating layer may have a stacked-layer structure. A region of the base insulating layer 102 where the first oxide layer 104 is to be formed is preferably subjected to planarization treatment such as CMP treatment to have a flat surface.

FIGS. 7A to 7C illustrate a structure in which the gate electrode layer 103 serving as a back gate electrode is added to the above transistor 200; however, one embodiment of the present invention is not limited thereto. It is also possible to add a gate electrode layer serving as a back gate electrode to the transistor 210 or the transistor 220.

Further, the gate electrode layer 116 of the transistor 230 may include a region that overlaps with the source electrode layer 112a and/or the drain electrode layer 112b. The transistor 200, the transistor 210, or the transistor 220 may have a structure in which the gate electrode layer 116 does not overlap with the source electrode layer 112a and the drain electrode layer 112b.

In a manner similar to the transistor 200, the transistors in Modification Examples 1 to 3 include a plurality of channel formation regions. In the transistor, the gate electrode layer covers the side surface and the top surface of each channel formation region. Thus, an electric field of the gate electrode layer is applied to each channel formation region from the side surface direction as well as from the top surface direction. Further, in the transistors in Modification Examples 1 to 3, an electric field can be effectively applied to a region in the vicinity of the interface between the oxide semiconductor layer and the first oxide layer, where electric field application is difficult. Such a structure makes it possible to favorably control the threshold voltage of the transistor and improve the S value thereof. Moreover, with the plurality of channel formation regions having such structures, the transistor can have increased effective channel width; thus, the on-state current of the transistor can be increased.

The structures, the methods, and the like described in this embodiment can be combined as appropriate with any of the structures, the methods, and the like described in the other embodiments.

Embodiment 2

In this embodiment, an example of an oxide semiconductor layer applicable to the transistor of Embodiment 1 will be described.

<Crystallinity of Oxide Semiconductor Layer>

An oxide semiconductor layer used for the transistor may be in a non-single-crystal state, for example. As examples of the non-single-crystal state, c-axis aligned crystal (CAAC), polycrystal, and microcrystal can be given.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31° which shows alignment appears in some cases. In the case of a crystal of $InGaZnO_4$, the peak at 2θ of around 31° indicates that the crystal of $InGaZnO_4$ has (009) plane alignment. Further, in the CAAC-OS, a peak appears at 2θ of around 36° in some cases. In the case of a crystal of $ZnGa_2O_4$, the peak at 2θ of around 36° indicates that the crystal of $ZnGa_2O_4$ has (222) plane alignment. In the CAAC-OS, it is preferable that the peak appear at 2θ of around 31° and do not appear at 2θ of around 36°.

In the CAAC-OS, for example, among crystal parts, the directions of the a-axis and the b-axis of one crystal part are different from those of another crystal part, in some cases. For example, when the CAAC-OS including a crystal of $InGaZnO_4$ is analyzed with an X-ray diffractometer by an in-plane method in which an X-ray enters a sample in the direction perpendicular to the c-axis, a peak appears at 2θ of around 56° in some cases. The peak at 2θ of around 56° is derived from the (110) plane of the $InGaZnO_4$ crystal. Here, when 2θ is fixed at around 56°, a sample is rotated using a normal vector of a surface of the sample as an axis (φ axis), and analysis (φ scan) is performed, although six peaks having symmetry appear in the case of a single crystal oxide semiconductor in which the directions of an a-axis and a b-axis of one crystal part are the same as those of another crystal part, a peak is not clearly observed in the case of the CAAC-OS.

As described above, in the CAAC-OS, for example, c-axes are aligned, and a-axes and/or b-axes are not macroscopically aligned, in some cases.

Further, for example, spots (luminescent spots) are observed in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern.

Figure 8A:
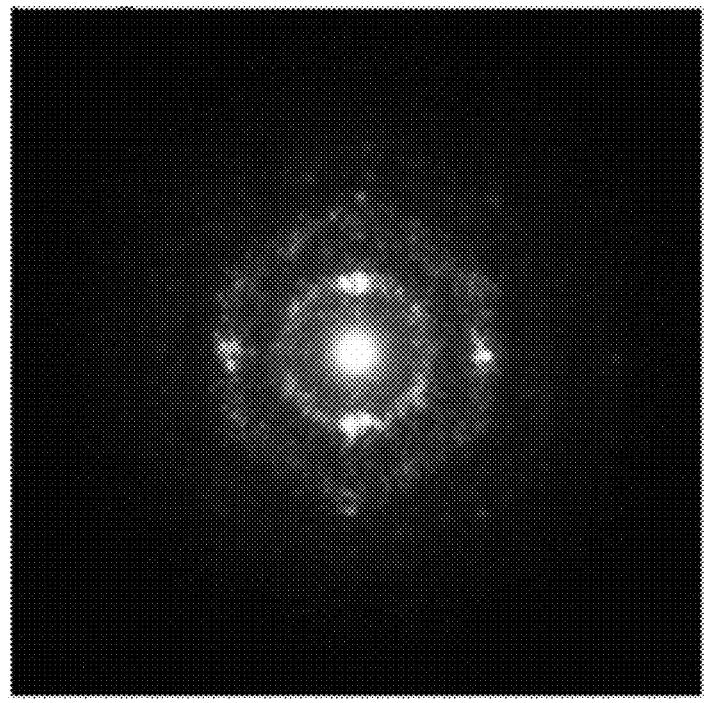
FIGS. 8A and 8B each show a nanobeam electron diffraction pattern of an oxide semiconductor.

FIG. 8A shows an example of a nanobeam electron diffraction pattern of a sample including CAAC-OS. Here, the sample is cut in the direction perpendicular to a surface where the CAAC-OS is formed and the thickness thereof is reduced to about 40 nm. Further, an electron beam with a diameter of 1 nmφ enters from the direction perpendicular to the cut surface of the sample. FIG. 8A shows that spots are observed in the nanobeam electron diffraction pattern of the CAAC-OS.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS is formed or a normal vector of the surface of the CAAC-OS.

The CAAC-OS can be obtained by reducing the impurity concentration, for example. The impurity means here an element other than the main components of the oxide semiconductor, such as hydrogen, carbon, silicon, or a transition metal element. In particular, an element such as silicon has a higher bonding strength to oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is mixed into the CAAC-OS, the crystal part in a region into which the impurity is mixed becomes amorphous or microcrystalline in some cases.

Further, the CAAC-OS can be formed by reducing the density of defect states, for example. In an oxide semiconductor, for example, oxygen vacancies are defect states. The oxygen vacancies serve as trap states or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

A transistor including the highly purified intrinsic or substantially highly purified intrinsic CAAC-OS has a small variation in the electrical characteristics due to irradiation with visible light or ultraviolet light.

The CAAC-OS can be formed by a sputtering method using a DC power source, for example.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

In an image obtained with a TEM, for example, crystal grains can be found in the polycrystalline oxide semiconductor in some cases. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystal grains can be found in the polycrystalline oxide semiconductor in some cases. Moreover, in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a single peak or a plurality of peaks appear in some cases. For example, in the case of polycrystalline In—Ga—Zn—O, a peak at 2θ of around 31° that shows an alignment or peaks showing a plurality of kinds of alignments appear in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor using the polycrystalline oxide semiconductor for a channel formation region has a high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a trap state or a carrier generation source, a transistor using the polycrystalline oxide semiconductor for a channel formation region has larger variation in electrical characteristics and lower reliability than a transistor using a CAAC-OS for a channel formation region in some cases.

The polycrystalline oxide semiconductor can be formed by high-temperature heat treatment or laser light treatment.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In the TEM image, for example, a boundary between an amorphous part and the crystal part and a boundary between the crystal parts in the nc-OS is not clearly observed in some cases. In an image of the nc-OS obtained with a TEM, for example, since a clear grain boundary does not exist, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than that of a crystal part, a peak which shows alignment does not appear in some cases. Further, for example, a halo pattern is observed in some cases in an electron diffraction pattern of the nc-OS obtained by using an electron beam having a diameter larger than that of a crystal part (e.g., a beam diameter of 20 nmϕ or more, or 50 nmϕ or more). For example, spots are observed in some cases in a nanobeam electron diffraction pattern of the nc-OS obtained by using an electron beam having a diameter smaller than or equal to that of a crystal part (e.g., a beam diameter of 10 nmϕ or less, or 5 nmϕ or less). In a nanobeam electron diffraction pattern of the nc-OS, for example, regions with high luminance in a circular pattern are observed in some cases. In a nanobeam electron diffraction pattern of the nc-OS, for example, a plurality of spots are observed in the region in some cases.

Figure 8B:
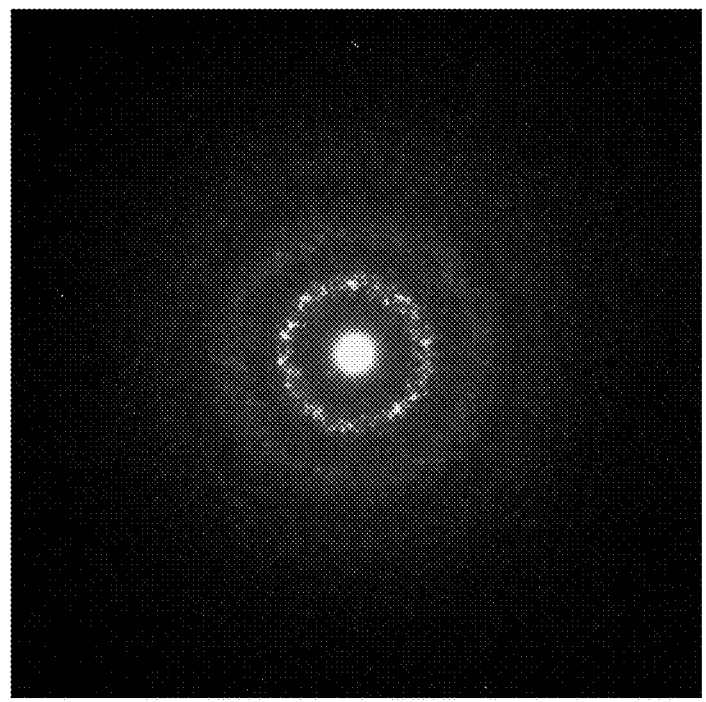

FIG. 8B is an example of a nanobeam electron diffraction pattern of a sample including nc-OS. Here, the sample is cut in the direction perpendicular to a surface where the nc-OS is formed and the thickness thereof is reduced to about 40 nm. Further, an electron beam with a diameter of 1 nmϕ enters from the direction perpendicular to the cut surface of the sample. FIG. 8B shows that regions with high luminance in a circular pattern are observed and a plurality of spots are observed in the region in the nanobeam electron diffraction pattern of the nc-OS.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Accordingly, the nc-OS has higher carrier density than the CAAC-OS in some cases. An oxide semiconductor with a high carrier density tends to have a high electron mobility. Therefore, a transistor using the nc-OS for a channel formation region has a high field-effect mobility in some cases. Further, the nc-OS has higher density of defect states than the CAAC-OS and thus has higher density of trap states in some cases. Therefore, a transistor using the nc-OS for a channel formation region has larger variation in electrical characteristics and lower reliability than a transistor using the CAAC-OS for a channel formation region. Note that the nc-OS can be obtained even when the amount of impurity contained therein is relatively large, and thus can be easily obtained than the CAAC-OS and in some cases, is preferably used depending on the application. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel formation region can be manufactured with high productivity.

An oxide semiconductor may include an amorphous part. Note that an oxide semiconductor including an amorphous part is referred to as an amorphous oxide semiconductor. An amorphous oxide semiconductor, for example, has disordered atomic arrangement and no crystal part. An amorphous oxide semiconductor, for example, does not have a specific shape as in quartz and regularity in atomic arrangement.

In an image obtained with a TEM, for example, crystal parts cannot be found clearly in the amorphous oxide semiconductor in some cases.

When an amorphous oxide semiconductor is analyzed by an out-of-plane method with an XRD apparatus, a peak which shows alignment does not appear in some cases. Further, a halo pattern is observed in an electron diffraction pattern of the amorphous oxide semiconductor in some cases. In other cases, a halo pattern is observed instead of a spot in a nanobeam electron diffraction pattern of the amorphous oxide semiconductor.

The amorphous oxide semiconductor can be formed in some cases, for example, by introducing impurities such as hydrogen at a high concentration. Hence, the amorphous oxide semiconductor is, for example, an oxide semiconductor containing impurities at a high concentration.

When an oxide semiconductor contains impurities at a high concentration, a defect state such as an oxygen vacancy is formed in the oxide semiconductor in some cases. This means that an amorphous oxide semiconductor with a high concentration of impurities has a high density of defect states. In addition, since the amorphous oxide semiconductor has low crystallinity, the density of defect states of the amorphous oxide semiconductor is higher than that of the CAAC-OS or the nc-OS.

Accordingly, the amorphous oxide semiconductor has much higher carrier density than the nc-OS in some cases. Therefore, a transistor using the amorphous oxide semiconductor for a channel formation region tends to be normally on, and sometimes can be preferably used for a transistor which needs to have such electrical characteristics. The amorphous oxide semiconductor has a high density of defect states and thus has a high density of trap states in some cases. Therefore, a transistor using the amorphous oxide semiconductor for a channel formation region has larger variation in electrical characteristics and lower reliability than a transistor using the CAAC-OS or the nc-OS for a channel formation region in some cases. Note that the amorphous oxide semiconductor can be formed even by a deposition method in which a relatively large amount of impurity is contained, and thus can be easily obtained and in some cases, is preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel formation region can be manufactured with high productivity.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

An oxide semiconductor may include a single crystal, for example. Note that an oxide semiconductor including a single crystal is referred to as a single crystal oxide semiconductor.

The single crystal oxide semiconductor has, for example, a low impurity concentration and a low density of defect states (a small number of oxygen vacancies), and thus has a low carrier density. Therefore, a transistor using the single crystal oxide semiconductor for a channel formation region is unlikely to be normally on. Further, the single crystal oxide semiconductor has a low density of defect states and thus has a low density of trap states in some cases. Therefore, a transistor using the single crystal oxide semiconductor for a channel formation region has a small variation in electrical characteristics and a high reliability in some cases.

The oxide semiconductor has a high density if including few defects, for example. The oxide semiconductor has a high density if containing impurities such as hydrogen at a low concentration. For example, the density of a single crystal oxide semiconductor is higher than that of a CAAC-OS in some cases. For example, the density of a CAAC-OS is higher than that of a microcrystalline oxide semiconductor in some cases. For example, the density of a polycrystalline oxide semiconductor is higher than that of a microcrystalline oxide semiconductor in some cases. For example, the density of a microcrystalline oxide semiconductor is higher than that of an amorphous oxide semiconductor in some cases.

Although the crystallinity of the oxide semiconductor layer has been described in detail here, since the first oxide layer and the second oxide layer provided over and under the oxide semiconductor layer are oxide layers including the same main components as the oxide semiconductor layer in the semiconductor device of one embodiment of the present invention, the first oxide layer and the second oxide layer may include CAAC, polycrystal, microcrystal, amorphous, or single crystal, or may be a mixed film including two or more kinds of these crystal states, as in the oxide semiconductor layer.

<Formation Method of CAAC-OS Film>

For example, a CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining its crystal state, whereby the CAAC-OS film can be formed.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

The first oxide semiconductor film with a thickness of greater than or equal to 1 nm and less than 10 nm can be easily crystallized by heat treatment as compared to the case where the first oxide semiconductor film has a thickness of greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film in a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film in a shorter time.

In the above-described manner, a CAAC-OS film with a total thickness of greater than or equal to 10 nm can be formed. The CAAC-OS film can be favorably used as the oxide semiconductor layer in the oxide stack.

Next, a method for forming an oxide film in the case where a formation surface has a low temperature because, for example, the substrate is not heated is described (for example, the temperature is lower than 130° C., lower than 100° C., lower than 70° C. or at room temperatures (20° C. to 25° C.)).

When the deposition surface has a low temperature, the sputtered particle flutters down on the deposition surface randomly. The sputtered particle does not migrate and thus is deposited randomly in areas including an area where another sputtered particle has already been deposited, for example. That is, for example, the thickness of the deposited oxide film is not uniform and the orientation of crystals is irregular in some cases. The oxide film deposited in this manner has a crystal part (nanocrystal) because the crystallinity of the sputtered particle is maintained to some degree.

In addition, for example, when the pressure during deposition is high, the sputtered particle that is flying collides with another particle (such as atom, molecule, ion, radical, or the like) of argon or the like in higher frequency. The crystal structure of the sputtered particle may be broken when the sputtered particle that is flying collides with another particle (the sputtered particle is re-sputtered). For example, when the sputtered particle collides with another particle, the sputtered particle cannot maintain the flat-plate shape and is broken into pieces (separated into atoms) in some cases. At this time, each atom separated from the sputtered particle is deposited on the deposition surface so that an amorphous oxide film is formed in some cases.

In addition, when a process in which a liquid is used or a process in which a solid target is vaporized is employed instead of a sputtering method using a polycrystalline oxide target, separated atoms fly and are deposited on a deposition surface and thus an amorphous oxide film is formed in some cases. In addition, for example, in a laser ablation method, atoms, molecules, ions, radicals, clusters, or the like released from a target fly and are deposited on the deposition surface so that an amorphous oxide film is formed in some cases.

An oxide layer or an oxide semiconductor layer in any of the above crystal states may be used for the first oxide layer, the oxide semiconductor layer, and the second oxide layer in the stacked structure including oxide layers and an oxide semiconductor layer and included in the transistor of one embodiment of the present invention. Note that it is preferable to use a CAAC-OS film as the oxide semiconductor layer serving as a channel.

In the case of using the CAAC-OS film as the oxide semiconductor layer, the second oxide layer provided over and in contact with the oxide semiconductor layer tends to have a crystal structure that is grown using a crystal of the oxide semiconductor layer as a seed crystal. Accordingly, even when the first oxide layer and the second oxide layer are formed using the same material and the same manufacturing method, the second oxide layer might have a higher crystallinity than the first oxide layer. Further, a region in contact with the oxide semiconductor layer and a region that is not in contact with the oxide semiconductor layer in the second oxide layer might have different crystallinities.

The structures, the methods, and the like described in this embodiment can be combined as appropriate with any of the structures, the methods, and the like described in the other embodiments.

Embodiment 3

Figure 9A:
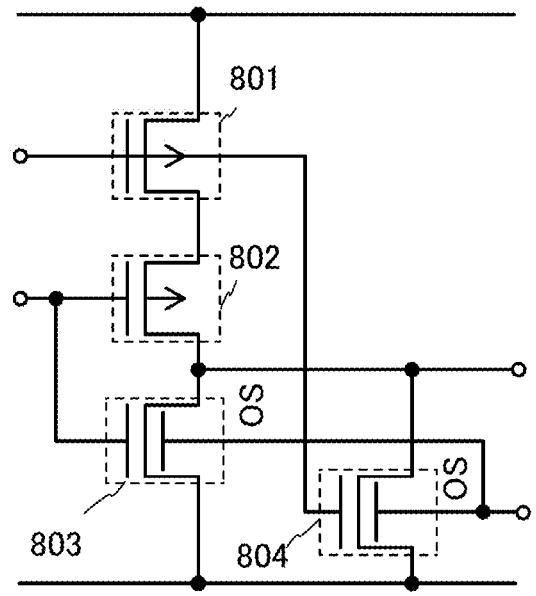
FIGS. 9A and 9B are each a circuit diagram of a semiconductor device of one embodiment of the present invention.
Figure 9B:
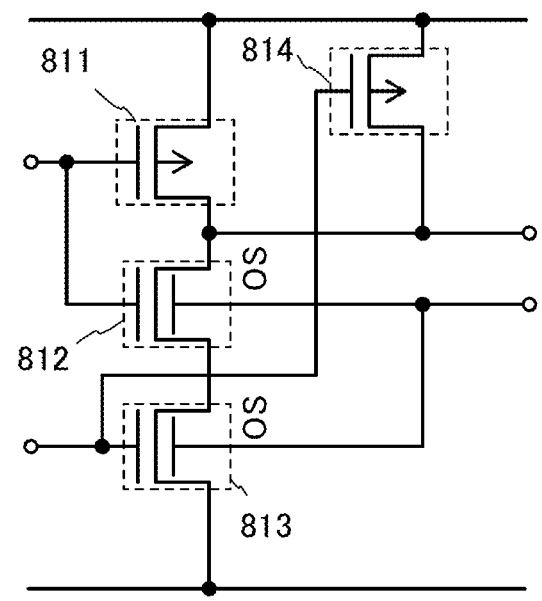

FIG. 9A illustrates an example of a circuit diagram of a NOR circuit, which is a logic circuit, as an example of the semiconductor device of one embodiment of the present invention. FIG. 9B is a circuit diagram of a NAND circuit.

In the NOR circuit in FIG. 9A, p-channel transistors 801 and 802 are transistors in each of which a channel formation region is formed using a semiconductor material (e.g., silicon) other than an oxide semiconductor, and n-channel transistors 803 and 804 each include an oxide stack including an oxide semiconductor and each have a structure similar to that of the transistor described in Embodiment 1.

A transistor including a semiconductor material such as silicon can easily operate at high speed. On the other hand, a transistor including an oxide semiconductor enables charge to be held for a long time owing to its characteristics.

To miniaturize the logic circuit, it is preferable that the n-channel transistors 803 and 804 be stacked over the p-channel transistors 801 and 802. For example, the transistors 801 and 802 can be formed using a single crystal silicon substrate, and the transistors 803 and 804 can be formed over the transistors 801 and 802 with an insulating layer provided therebetween.

Note that in the NOR circuit shown in FIG. 9A, the transistors 803 and 804 have the structure similar to the transistor 230, and by controlling the potential of the second gate electrode, for example, by setting the potential to GND, the threshold voltages of the transistors 803 and 804 are increased, so that the transistors can be normally off.

In the NAND circuit in FIG. 9B, p-channel transistors 811 and 814 are transistors in each of which a channel formation region is formed using a semiconductor material (e.g., silicon) other than an oxide semiconductor, and n-channel transistors 812 and 813 each include an oxide stack including an oxide semiconductor and each have a structure similar to that of the transistor described in Embodiment 1.

Note that in the NAND circuit shown in FIG. 9B, the transistors 812 and 813 have the structure similar to the transistor 230, and by controlling the potential of the second gate electrode, for example, by setting the potential to GND, the threshold voltages of the transistors 812 and 813 are increased, so that the transistors can be normally off.

As in the NOR circuit in FIG. 9A, to miniaturize the logic circuit, it is preferable that the n-channel transistors 812 and 813 be stacked over the p-channel transistors 811 and 814.

By using a transistor including an oxide semiconductor for a channel formation region and having extremely small off-state current for the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

In addition, by employing any of the structures of the transistors described in Embodiment 1, a NOR circuit and a NAND circuit with high reliability and stable characteristics can be provided.

Note that the NOR circuit and the NAND circuit including the transistor described in Embodiment 1 are described as examples in this embodiment; however, the present invention is not particularly limited to those circuits, and an AND circuit, an OR circuit, or the like can be formed.

The structures, the methods, and the like described in this embodiment can be combined as appropriate with any of the structures, the methods, and the like described in the other embodiments.

Embodiment 4

In this embodiment, an example of a semiconductor device (memory device) which includes the transistor described in Embodiment 1, which can hold stored data even when not powered, and which has an unlimited number of write cycles will be described with reference to drawings.

Figure 10A:
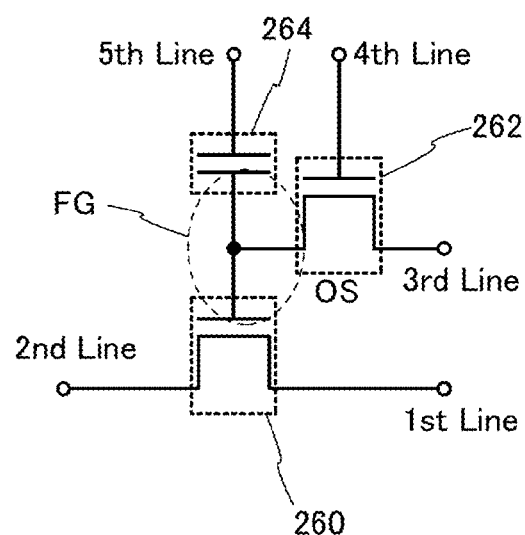
FIGS. 10A to 10C are circuit diagrams and a conceptual diagram of a semiconductor device of one embodiment of the present invention.

FIG. 10A is a circuit diagram illustrating the semiconductor device of this embodiment.

A transistor including a semiconductor material (e.g., silicon) other than an oxide semiconductor can be used as a transistor 260 illustrated in FIG. 10A and thus the transistor 260 can easily operate at high speed. Further, a structure similar to that of the transistor described in Embodiment 1, which includes an oxide stack including an oxide semiconductor, can be used as a transistor 262 to enable charge to be held for a long time owing to its characteristics.

Although all the transistors are n-channel transistors here, p-channel transistors can be used for the semiconductor device described in this embodiment.

In FIG. 10A, a first wiring (1st Line) is electrically connected to one of a source electrode layer and a drain electrode layer of the transistor 260, and a second wiring (2nd Line) is electrically connected to the other of the source electrode layer and the drain electrode layer of the transistor 260. A third wiring (3rd Line) is electrically connected to one of a source electrode layer and a drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) and the other electrode of the capacitor 264 are electrically connected to each other.

The semiconductor device in FIG. 10A can write, hold, and read data as described below, utilizing the potential holding characteristics of the transistor 260 by which the potential of the gate electrode layer can be held.

Writing and holding of data will be described. First, the potential of the fourth wiring is set to a potential at which the transistor 262 is turned on, so that the transistor 262 is turned on. Thus, the potential of the third wiring is applied to the gate electrode layer of the transistor 260 and the capacitor 264. In other words, a predetermined charge is supplied to the gate electrode layer of the transistor 260 (writing). Here, one of two kinds of charges providing different potential levels (hereinafter referred to as a low-level charge and a high-level charge) is supplied. After that, the potential of the fourth wiring is set to a potential at which the transistor 262 is turned off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data will be described. By supplying an appropriate potential (reading potential) to the fifth wiring while supplying a predetermined potential (constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where a High level charge is given to the gate electrode layer of the transistor 260 is lower than an apparent threshold voltage $V_{th\_L}$ in the case where a Low level charge is given to the gate electrode layer of the transistor 260. Here, an apparent threshold voltage refers to the potential of the fifth wiring, which is needed to turn on the transistor 260. Thus, the potential of the fifth wiring is set to a potential $V_0$ which is between $V_{th\_H}$ and $V_{th\_L}$, whereby charge supplied to the gate electrode layer of the transistor 260 can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. Therefore, the stored data can be read by the potential of the second wiring.

Note that in the case where memory cells are arrayed to be used, only data of desired memory cells needs to be read. In the case where such reading is not performed, a potential at which the transistor 260 is off regardless of the state of the gate electrode layer, that is, a potential smaller than $V_{th\_H}$ may be supplied to the fifth wiring. Alternatively, a potential at which the transistor 260 is on regardless of the state of the gate electrode layer, that is, a potential larger than $V_{th\_L}$ may be supplied to the fifth wiring.

Figure 10B:
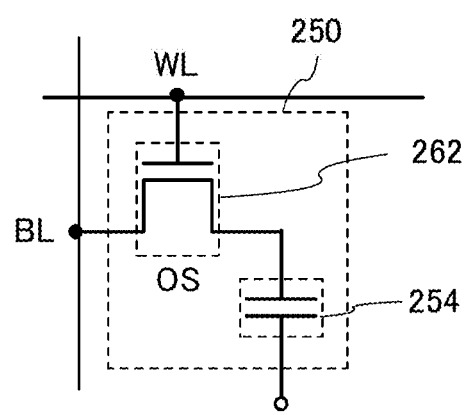
Figure 10C:
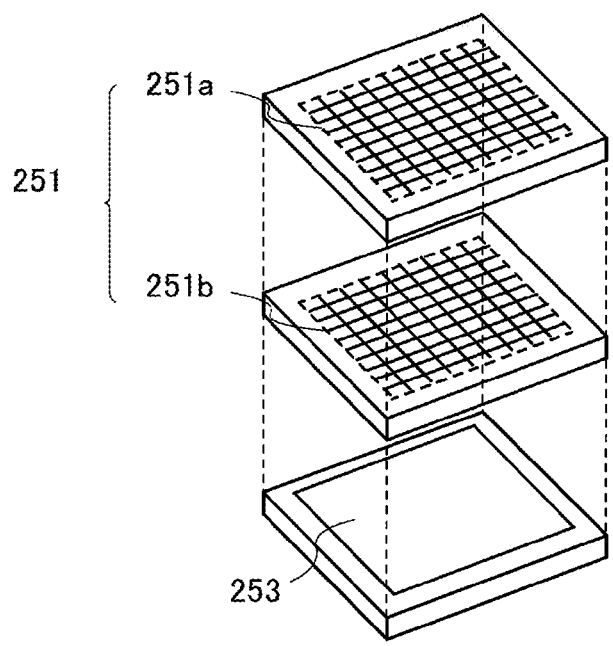

FIG. 10B illustrates another example of one embodiment of a structure of a memory device. FIG. 10B illustrates an example of a circuit configuration of a semiconductor device, and FIG. 10C is a conceptual diagram illustrating an example of a semiconductor device. First, the semiconductor device illustrated in FIG. 10B will be described, and then the semiconductor device illustrated in FIG. 10C will be described.

In the semiconductor device illustrated in FIG. 10B, a bit line BL is electrically connected to one of the source electrode layer and the drain electrode layer of the transistor 262, a word line WL is electrically connected to the gate electrode layer of the transistor 262, and the other of the source electrode layer and the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 10B are described.

First, the potential of the word line WL is set to a potential at which the transistor 262 is turned on, so that the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or the charge accumulated in the capacitor) can be held for a long time.

Next, reading of data is described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is expressed as $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 10B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 10C is described.

The semiconductor device illustrated in FIG. 10C includes memory cell arrays 251a and 251b including a plurality of memory cells 250 illustrated in FIG. 10B as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 10C, the peripheral circuit 253 can be provided under the memory cell array 251 (the memory cell arrays 251a and 251b). Thus, the size of the semiconductor device can be reduced.

It is preferable that a semiconductor material of a transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 10C illustrates, as an example, the semiconductor device in which two memory cell arrays 251 (the memory cell arrays 251a and 251b) are stacked; however, the number of memory cell arrays which are stacked is not limited thereto. Three or more memory cells arrays may be stacked.

When a transistor including an oxide semiconductor in a channel formation region is used as the transistor 262, stored data can be held for a long time. In other words, power consumption can be sufficiently reduced because a semiconductor memory device in which refresh operation is unnecessary or the frequency of refresh operation is extremely low can be provided.

Further, the transistor described in Embodiment 1, which includes an oxide stack including an oxide semiconductor layer where a channel formation region is formed apart from the surface of the oxide stack is used in the semiconductor device of this embodiment. Thus, a highly reliable semiconductor device having stable electrical characteristics can be provided.

Embodiment 5

In this embodiment, application examples of the semiconductor device described in any of the above embodiments to electronic devices such as mobile phones, smartphones, or e-book readers will be described with reference to FIG. 11, FIG. 12, FIG. 13, and FIGS. 14A and 14B.

Figure 11:
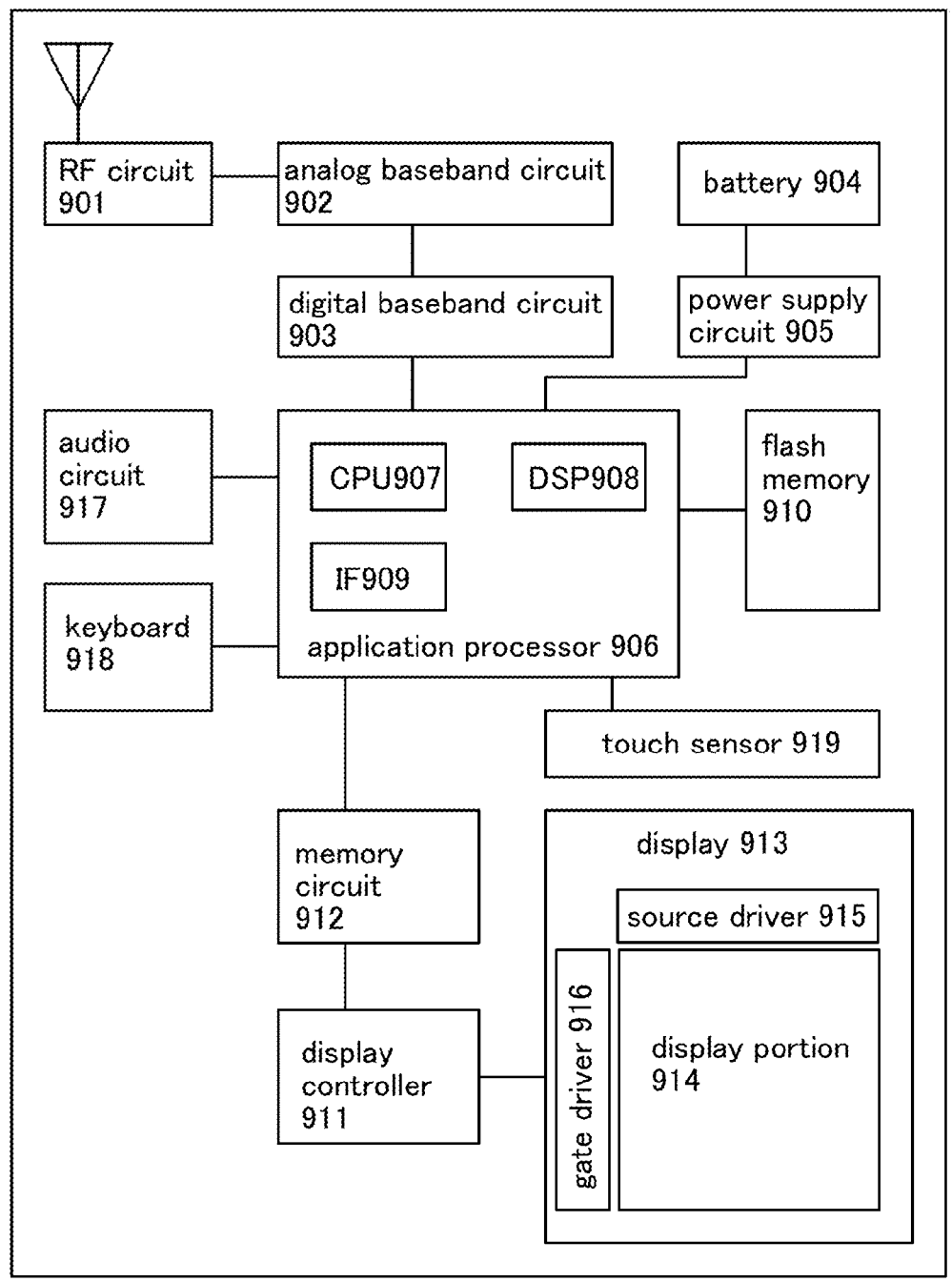
FIG. 11 is a block diagram of a semiconductor device of one embodiment of the present invention.

FIG. 11 is a block diagram of an electronic device. An electronic device illustrated in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 12:
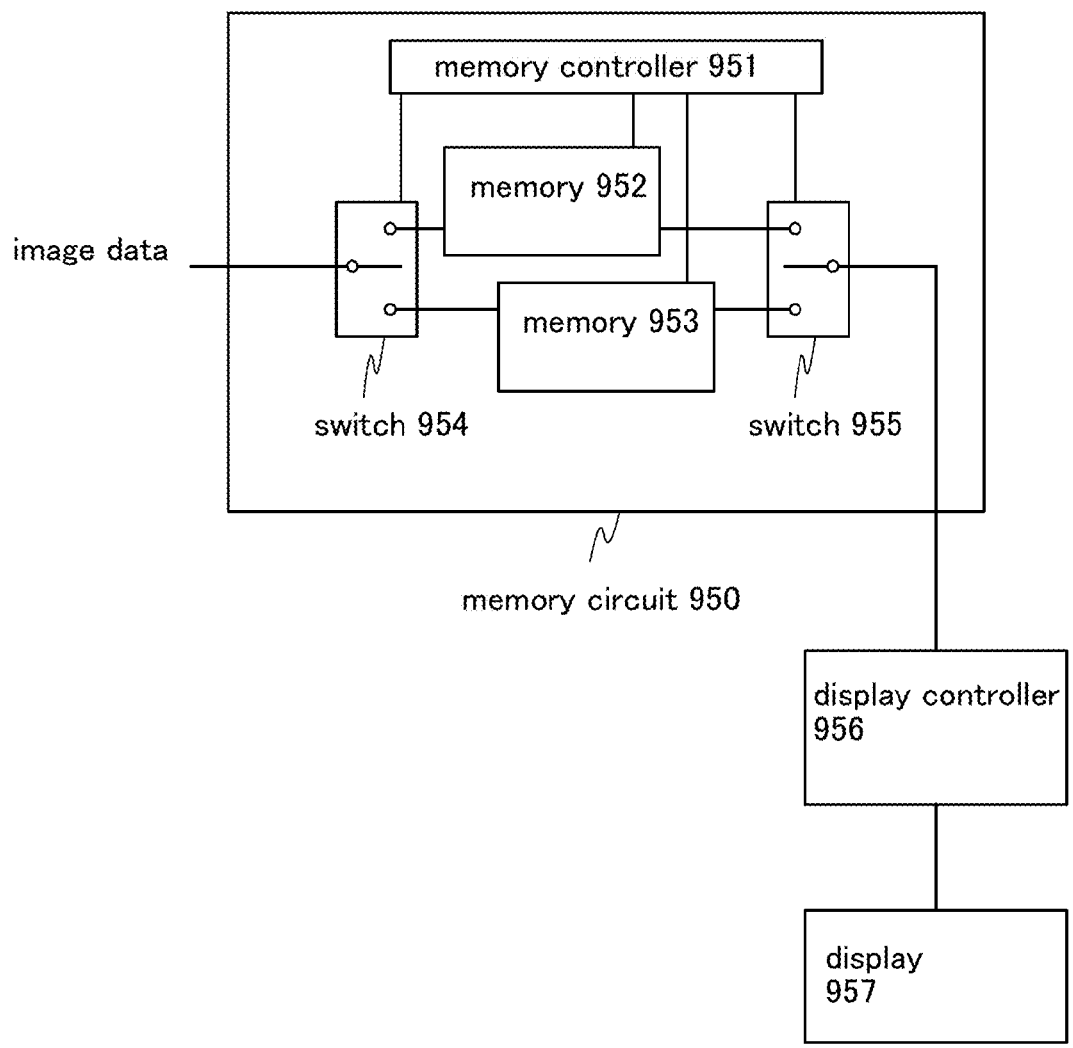
FIG. 12 is a block diagram of a semiconductor device of one embodiment of the present invention.

FIG. 12 illustrates an example in which any of the semiconductor devices described in the above embodiments is used for a memory circuit 950 in a display. The memory circuit 950 illustrated in FIG. 12 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 through the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories, and a single memory may be divided and used. By employing any of the semiconductor devices described in the above embodiments for the memory 952 and the memory 953, data can be written and read at high speed and held for a long time, and power consumption can be sufficiently reduced. Further, a semiconductor device which is hardly affected by entry of water, moisture, and the like from the outside and has high reliability can be provided.

Figure 13:
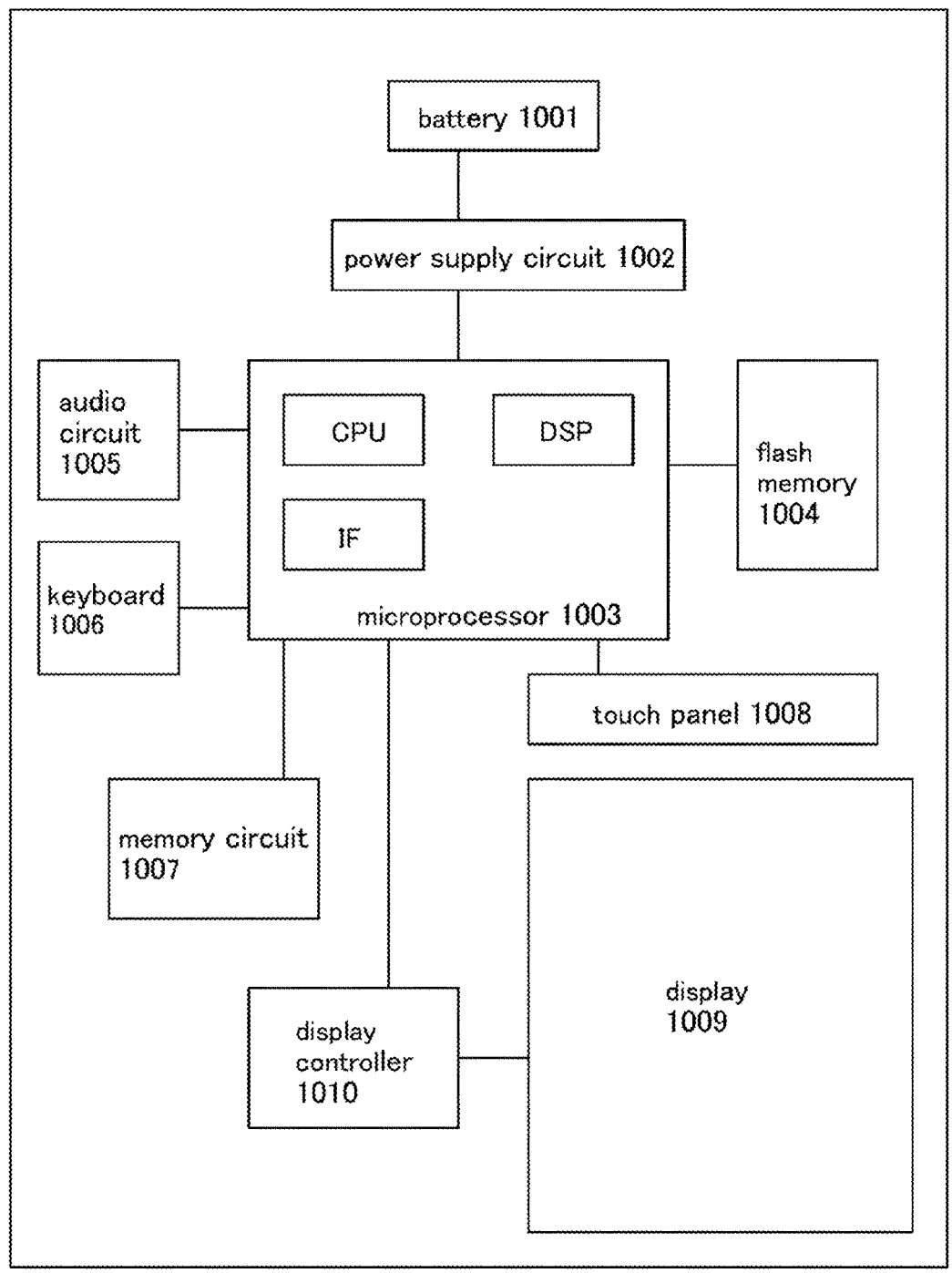
FIG. 13 is a block diagram of a semiconductor device of one embodiment of the present invention.

FIG. 13 is a block diagram of an e-book reader. The electronic book in FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 13. The memory circuit 1007 has a function of temporarily storing the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor devices described in any of the above embodiments, data can be written and read at high speed and held for a long time, and power consumption can be sufficiently reduced. Further, a semiconductor device which is hardly affected by entry of water, moisture, and the like from the outside and has high reliability can be provided.

Figure 14A:
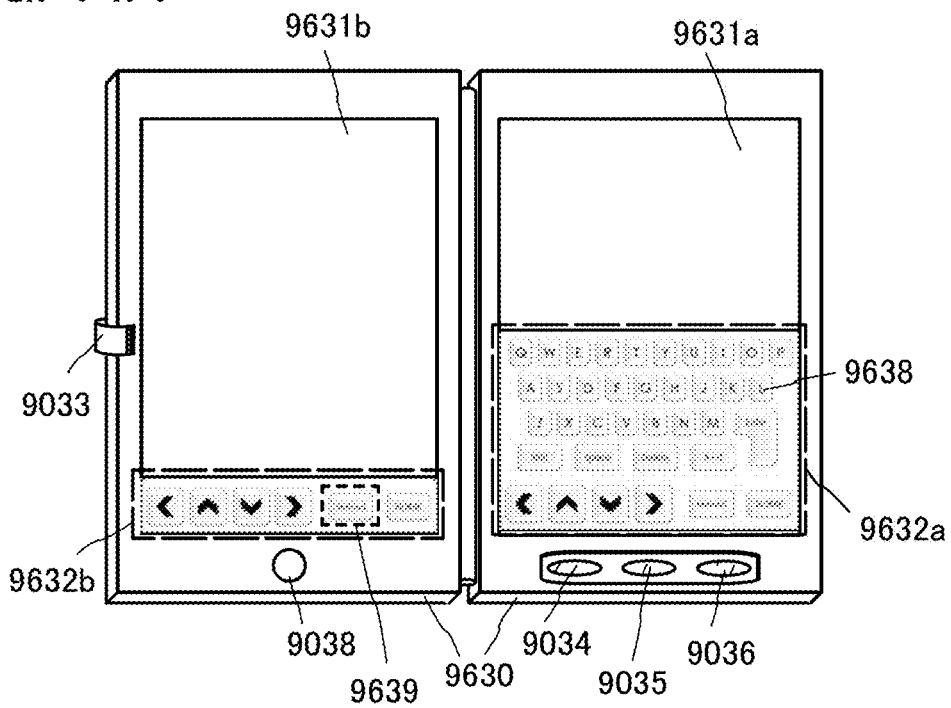
FIGS. 14A and 14B illustrate an electronic device in which a semiconductor device of one embodiment of the present invention can be used.
Figure 14B:
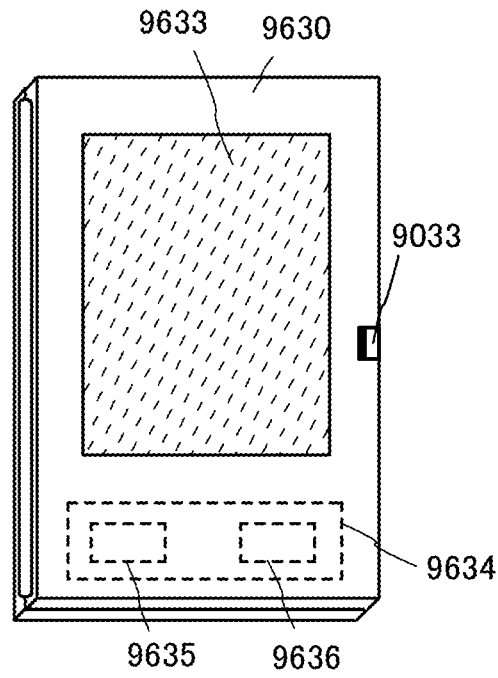

FIGS. 14A and 14B illustrate a specific example of an electronic device. FIGS. 14A and 14B illustrate a foldable tablet terminal. The tablet terminal is opened in FIG. 14A. The tablet terminal includes a housing 9630, a display portion 9631a, a display portion 9631b, a display mode switch 9034, a power switch 9035, a power saver switch 9036, a clasp 9033, and an operation switch 9038.

Any of the semiconductor devices described in the above embodiments can be used for the display portion 9631a and the display portion 9631b, so that the tablet terminal can have high reliability. In addition, the memory device described in the above embodiment may be applied to the semiconductor device of this embodiment.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to this structure. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631a and the display portion 9631b have the same display area in FIG. 14A, one embodiment of the present invention is not limited to this structure. The display portion 9631a and the display portion 9631b may have different areas or different display quality. For example, one of them may be a display panel that can display higher-definition images than the other.

The tablet terminal is closed in FIG. 14B. The tablet terminal includes the housing 9630, a solar cell 9633, a charge and discharge control circuit 9634, a battery 9635, and a DCDC converter 9636. In FIG. 14B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 14A and 14B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The structures, the methods, and the like described in this embodiment can be combined as appropriate with any of the structures, the methods, and the like described in the other embodiments.

EXPLANATION OF REFERENCE

100: substrate, 102: base insulating layer, 103: gate electrode layer, 104: first oxide layer, 106: oxide semiconductor layer, 106a: channel formation region, 106b: channel formation region, 106c: channel formation region, 108: second oxide layer, 110: oxide stack, 112a: source electrode layer, 112b: drain electrode layer, 114: gate insulating layer, 116: gate electrode layer, 200: transistor, 210: transistor, 220: transistor, 230: transistor, 250: memory cell, 251: memory cell array, 251*a*: memory cell array, 251*b*: memory cell array, 253: peripheral circuit, 254: capacitor, 260: transistor, 262: transistor, 264: capacitor, 801: transistor, 802: transistor, 803: transistor, 804: transistor, 811: transistor, 812: transistor, 813: transistor, 814: transistor, 901: RF circuit, 902: analog baseband circuit, 903: digital baseband circuit, 904: battery, 905: power supply circuit, 906: application processor, 907: CPU, 908: DSP, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 1001: battery, 1002: power supply circuit, 1003: microprocessor, 1004: flash memory, 1005: audio circuit, 1006: keyboard, 1007: memory circuit, 1008: touch panel, 1009: display, 1010: display controller, 9033: clasp, 9034: switch, 9035: power switch, 9036: switch, 9038: operation switch, 9630: housing, 9631*a*: display portion, 9631*b*: display portion, 9632*a*: region, 9632*b*: region, 9633: solar cell, 9634: charge and discharge control circuit, 9635: battery, 9636: DCDC converter, 9638: operation key, 9639: button.

This application is based on Japanese Patent Application serial no. 2013-050829 filed with Japan Patent Office on Mar. 13, 2013, the entire contents of which are hereby incorporated by reference.

The invention claimed is:

1. A semiconductor device comprising:
    a first oxide layer comprising at least one of indium, gallium and zinc;
    an oxide semiconductor layer including a first channel formation region and a second channel formation region, the oxide semiconductor layer being in contact with a top surface of the first oxide layer;
    a second oxide layer in contact with a top surface of the oxide semiconductor layer and comprising at least one of indium, gallium and zinc;
    a source electrode layer and a drain electrode layer electrically connected to the oxide semiconductor layer;
    a gate electrode layer covering a side surface and a top surface of the first channel formation region and a side surface and a top surface of the second channel formation region; and
    a gate insulating layer between the oxide semiconductor layer and the gate electrode layer,
    wherein a portion of the first oxide layer is surrounded by the oxide semiconductor layer when seen from a direction perpendicular to a surface of the first oxide layer, and
    wherein the second oxide layer is in contact with a top surface of the portion of the first oxide layer.

2. The semiconductor device according to claim 1, wherein the oxide semiconductor layer contains indium, gallium and zinc.

3. The semiconductor device according to claim 1, wherein the second oxide layer covers the side surface and the top surface of the first channel formation region and the side surface and the top surface of the second channel formation region.

4. The semiconductor device according to claim 1, wherein an end portion of the first oxide layer, an end portion of the oxide semiconductor layer, and an end portion of the second oxide layer are aligned with each other in a cross section.

5. The semiconductor device according to claim 1,
    wherein the source electrode layer is in contact with one of side surfaces of the first oxide layer and one of side surfaces and a part of a top surface of the oxide semiconductor layer, and
    wherein the drain electrode layer is in contact with the other of the side surfaces of the first oxide layer and the other of the side surfaces and another part of the top surface of the oxide semiconductor layer.

6. The semiconductor device according to claim 1, further comprising:
    a base insulating layer below the first oxide layer,
    wherein the base insulating layer comprises oxygen, and
    wherein the base insulating layer is capable of supplying oxygen to the oxide semiconductor layer.

7. The semiconductor device according to claim 1, wherein the gate electrode layer overlaps with an end portion of the source electrode layer and an end portion of the drain electrode layer.

8. A semiconductor device comprising:
    a first gate electrode layer;
    a first gate insulating layer over the first gate electrode layer;
    a first oxide layer over the first gate insulating layer and comprising at least one of indium, gallium and zinc;
    an oxide semiconductor layer including a first channel formation region and a second channel formation region, the oxide semiconductor layer being in contact with a top surface of the first oxide layer, wherein the first channel formation region and the second channel formation region overlap with the first gate electrode layer;
    a second oxide layer in contact with a top surface of the oxide semiconductor layer and comprising at least one of indium, gallium and zinc;
    a source electrode layer and a drain electrode layer electrically connected to the oxide semiconductor layer;
    a second gate electrode layer covering a side surface and a top surface of the first channel formation region and a side surface and a top surface of the second channel formation region; and
    a second gate insulating layer between the oxide semiconductor layer and the second gate electrode layer,
    wherein a portion of the first oxide layer is surrounded by the oxide semiconductor layer when seen from a direction perpendicular to a surface of the first oxide layer, and
    wherein the second oxide layer is in contact with a top surface of the portion of the first oxide layer.

9. The semiconductor device according to claim 8, wherein the oxide semiconductor layer contains indium, gallium and zinc.

10. The semiconductor device according to claim 8, wherein the second oxide layer covers the side surface and the top surface of the first channel formation region and the side surface and the top surface of the second channel formation region.

11. The semiconductor device according to claim 8, wherein an end portion of the first oxide layer, an end portion of the oxide semiconductor layer, and an end portion of the second oxide layer are aligned with each other in a cross section.

12. The semiconductor device according to claim 8,
    wherein the source electrode layer is in contact with one of side surfaces of the first oxide layer and one of side surfaces and a part of a top surface of the oxide semiconductor layer, and wherein the drain electrode layer is in contact with the other of the side surfaces of the first oxide layer and the other of the side surfaces and another part of the top surface of the oxide semiconductor layer.

13. The semiconductor device according to claim 8, wherein the first gate insulating layer comprises oxygen, and
wherein the first gate insulating layer is capable of supplying oxygen to the oxide semiconductor layer.

14. The semiconductor device according to claim 8, wherein the second gate electrode layer does not overlap with the source electrode layer and the drain electrode layer.

* * * * *